(12) United States Patent
Oak et al.

(10) Patent No.: US 10,833,584 B2
(45) Date of Patent: Nov. 10, 2020

(54) BOOT-STRAPPING SYSTEMS AND TECHNIQUES FOR CIRCUITS

(71) Applicant: Empower Semiconductor, Inc., Palos Verdes Estates, CA (US)

(72) Inventors: Parag Oak, Sunnyvale, CA (US); Timothy A. Phillips, Cranston, RI (US)

(73) Assignee: Empower Semiconductor, Inc., Fremont, CA (US)

( * ) Notice: Subject to any disclaimer, the term of this patent is extended or adjusted under 35 U.S.C. 154(b) by 0 days.

(21) Appl. No.: 15/349,691

(22) Filed: Nov. 11, 2016

(65) Prior Publication Data

US 2017/0194860 A1 Jul. 6, 2017

Related U.S. Application Data

(60) Provisional application No. 62/254,570, filed on Nov. 12, 2015.

(51) Int. Cl.
*H02M 3/158* (2006.01)
*H03K 17/0416* (2006.01)
*H03K 17/10* (2006.01)

(52) U.S. Cl.
CPC ...... *H02M 3/158* (2013.01); *H03K 17/04163* (2013.01); *H03K 17/102* (2013.01)

(58) Field of Classification Search
CPC ..... G06F 3/00; G06F 3/1295; H03K 19/0175; H03K 5/003
USPC ....................................................... 327/333
See application file for complete search history.

(56) References Cited

U.S. PATENT DOCUMENTS

| | | |
|---|---|---|
| 5,684,688 A | 11/1997 | Rouaud et al. |
| 7,138,994 B2 | 11/2006 | Cho et al. |
| 7,834,579 B2 | 11/2010 | Nojima |
| 8,212,537 B2 | 7/2012 | Carpenter |
| 8,330,504 B2 | 12/2012 | Olson |
| 8,427,113 B2 | 4/2013 | Xing et al. |
| 8,692,609 B2 | 4/2014 | Olson |
| 8,847,636 B2 | 9/2014 | Kerr |
| 9,030,857 B2 | 5/2015 | Martini |
| 9,041,144 B2 | 5/2015 | Smith |
| 9,300,210 B1 | 3/2016 | Lidsky et al. |
| 9,780,656 B2 | 10/2017 | Lidsky et al. |
| 9,780,663 B2 | 10/2017 | Lidsky et al. |
| 9,806,611 B2 | 10/2017 | Wang |
| 9,843,258 B2 | 12/2017 | Phillips |

(Continued)

FOREIGN PATENT DOCUMENTS

| | | |
|---|---|---|
| WO | WO-2012074967 A1 | 6/2012 |
| WO | WO-2014007745 A1 | 1/2014 |
| WO | WO-2019/005924 A1 | 1/2019 |

OTHER PUBLICATIONS

Kesarwani, Kapil et al., "A 2-phase resonant switched-capacitor converter delivering 4.3W at 0.6W/mm$^2$ with 85% efficiency," ISSCC 2014/Session 4/DC-DC Converters/4.5, pp. 1-3.

(Continued)

*Primary Examiner* — Nguyen Tran
(74) *Attorney, Agent, or Firm* — Goodwin Procter LLP

(57) ABSTRACT

Boot-strapping systems and techniques for circuits are described. One or more solid-state switches of a switched regulation circuit may be implemented using core transistors and the boot-strapping systems, rather than I/O transistors.

7 Claims, 17 Drawing Sheets

(56) References Cited

U.S. PATENT DOCUMENTS

| | | |
|---|---|---|
| 9,985,526 B1 | 5/2018 | Oak |
| 10,186,945 B1 | 1/2019 | Lidsky et al. |
| 10,389,240 B2 | 8/2019 | Phillips |
| 10,389,246 B1 | 8/2019 | Lidsky et al. |
| 10,468,963 B2 | 11/2019 | Lidsky et al. |
| 2004/0036686 A1 | 2/2004 | Cho et al. |
| 2004/0141345 A1 | 7/2004 | Cheng et al. |
| 2004/0145919 A1 | 7/2004 | Hazucha |
| 2005/0017699 A1 | 1/2005 | Stanley |
| 2005/0099364 A1 | 5/2005 | Jung et al. |
| 2005/0190583 A1 | 9/2005 | Morimoto et al. |
| 2008/0157723 A1 | 7/2008 | Xing et al. |
| 2008/0204109 A1* | 8/2008 | Pilling ............... H03K 19/0013 327/333 |
| 2009/0033266 A1 | 2/2009 | Kreinbrink |
| 2010/0244798 A1 | 9/2010 | Nakatomi et al. |
| 2010/0283439 A1 | 11/2010 | Singh |
| 2011/0018511 A1 | 1/2011 | Carpenter et al. |
| 2011/0260780 A1 | 10/2011 | Granger-Jones |
| 2011/0316502 A1 | 12/2011 | Tang et al. |
| 2012/0326680 A1 | 12/2012 | Burns et al. |
| 2013/0002149 A1 | 1/2013 | Mott |
| 2013/0002215 A1 | 1/2013 | Ikeda et al. |
| 2013/0021011 A1 | 1/2013 | Okuda et al. |
| 2013/0083580 A1 | 4/2013 | Komiya et al. |
| 2013/0119961 A1 | 5/2013 | Okuda et al. |
| 2013/0207625 A1 | 8/2013 | Futamura |
| 2014/0006833 A1 | 1/2014 | Ma et al. |
| 2014/0037287 A1 | 2/2014 | Liu |
| 2014/0210429 A1 | 7/2014 | Daily |
| 2014/0232364 A1 | 8/2014 | Thomas et al. |
| 2014/0266135 A1 | 9/2014 | Zhak et al. |
| 2014/0306674 A1 | 10/2014 | Kondou et al. |
| 2014/0361755 A1 | 12/2014 | Tateishi et al. |
| 2014/0376287 A1 | 12/2014 | Narimani et al. |
| 2015/0061382 A1 | 3/2015 | Roessler |
| 2015/0061613 A1 | 3/2015 | Kondou |
| 2015/0194904 A1 | 7/2015 | Harbourt |
| 2015/0280608 A1 | 10/2015 | Yoscovich et al. |
| 2015/0311895 A1* | 10/2015 | Ali ............... H03K 19/017509 327/319 |
| 2016/0013734 A1 | 1/2016 | White |
| 2016/0118886 A1 | 4/2016 | Zhang et al. |
| 2016/0129796 A1 | 5/2016 | Tomura et al. |
| 2016/0149486 A1* | 5/2016 | Roth ............... H02M 3/155 327/543 |
| 2016/0248329 A1 | 8/2016 | Phillips |
| 2016/0254746 A1 | 9/2016 | Lerdworatawee |
| 2016/0261185 A1 | 9/2016 | Lidsky et al. |
| 2016/0261189 A1 | 9/2016 | Lidsky et al. |
| 2016/0285386 A1 | 9/2016 | Kataoka et al. |
| 2016/0329809 A1 | 11/2016 | Granato |
| 2017/0085176 A1 | 3/2017 | Mathe |
| 2017/0093153 A1 | 3/2017 | Keane |
| 2017/0149336 A1 | 5/2017 | Kidera et al. |
| 2017/0194860 A1 | 7/2017 | Oak |
| 2017/0244321 A1 | 8/2017 | Phillips |
| 2017/0250607 A1 | 8/2017 | Zhak et al. |
| 2017/0353116 A1 | 12/2017 | Zhang et al. |
| 2017/0373598 A1 | 12/2017 | Nishimura et al. |
| 2018/0006559 A1 | 1/2018 | Chen |
| 2018/0054121 A1 | 2/2018 | Chen |
| 2019/0006933 A1 | 1/2019 | Lidsky et al. |
| 2019/0068057 A9 | 2/2019 | Phillips |
| 2019/0115823 A1 | 4/2019 | Lidsky et al. |
| 2019/0341849 A1 | 11/2019 | Lidsky et al. |

OTHER PUBLICATIONS

Kesarwani, Kapil et al., "Resonant switched-capacitor converters for chip-scale power delivery: Modeling and design," *Control and Modeling for Power Electronics (COMPEL)*, 2013 IEEE *14th Workshop on*, vol., No., pp. 1-7 Jun. 2013.

U.S. Appl. No. 15/689,997, filed Aug. 29, 2017.

U.S. Appl. No. 16/513,473, filed Jul. 16, 2019.

U.S. Appl. No. 15/653,262, filed Jul. 18, 2017.

U.S. Appl. No. 16/584,937, filed Sep. 26, 2019.

U.S. Appl. No. 16/503,603, filed Jul. 4, 2019.

Kesarwani, Kapil et al., "Resonant switched-capacitor converters for chip-scale power delivery: Modeling and design," *Control and Modeling for Power Electronics (COMPEL)*, 2013 IEEE *14th Workshop on*, pp. 1, 7, Jun. 23-26, 2013.

Kesarwani, Kapil et al., "A 2-phase resonant switched-capacitor converter delivering 4.3W at 0.6W/mm$^2$ with 85% efficiency," ISSCC 2014/Session 4/DC-DC Converters/4.5, pp. 1-3, 2014.

Kim, Wonyoung et al., "A fully-Intergrated 3-Level DC-DC converter for Nanosecond-Scale DVFS," IEEE Journal of Solid State Circuits vol. 47, No. 1, Jan. 2012, pp. 206-219.

Stauth, Jason T. et al., "Resonant switched capacitor converters for high-density power delivery," Thayer School of Engineering at Dartmouth, 2014, pp. 1-23.

Yousefzadeh, Vahid et al. "Three-level buck converter for envelope tracking applications" IEEE Transactions on Power Electronics, vol. 21, No. 2, Mar. 2006, pp. 549-552.

Kursun et al., "High input voltage step-down DC-DC converters for integration in a low voltage CMOS process", International Symposium on Signals, Circuits and Systems. Proceedings, SCS 2004, pp. 517-521.

Pashmineh et al., "A high-voltage driver based on stacked low-voltage transistors with minimized on-resistance for a buck converter in 65 nm CMOS", 2016 IEEE Canadian Conference on Electrical and Computer Engineering (CCECE), May 2016, pp. 1-5.

International Search Report and Written Opinion for International Application No. PCT/US2018/039697, dated Oct. 8, 2018, 7 pages.

Azarnaminy, "Inductive Buck Converter Based on Low Voltage Nano-Scale Cmos" Thesis, Aug. 2014 (66 pages).

\* cited by examiner

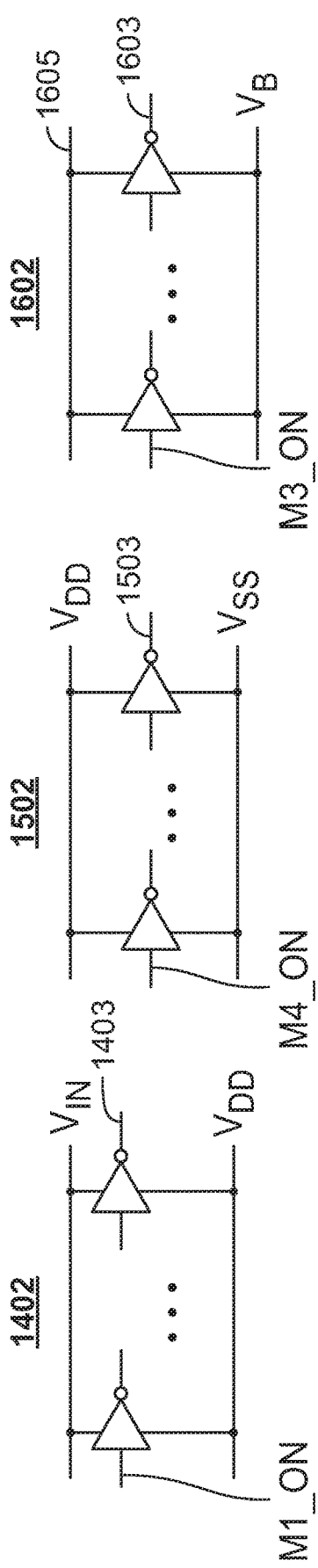
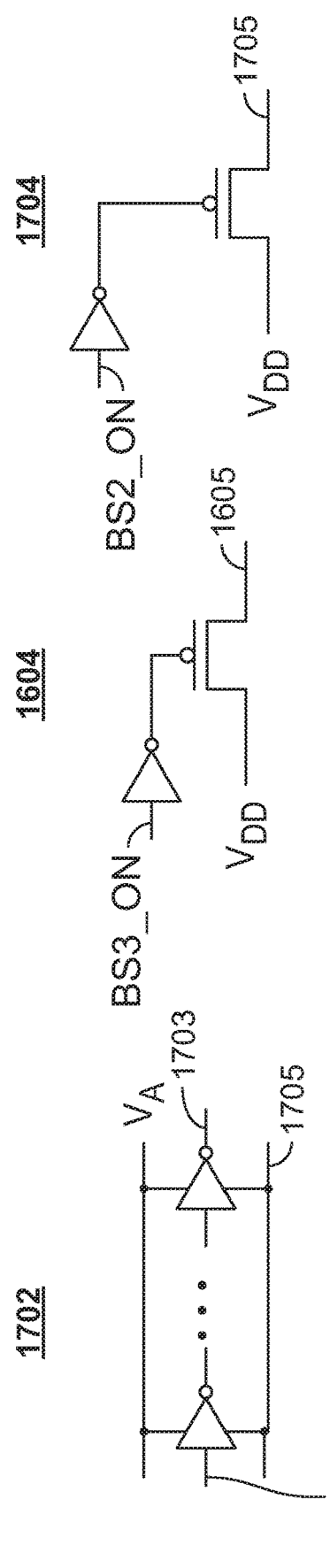

BOOT-STRAPPING SYSTEMS AND TECHNIQUES FOR CIRCUITS

CROSS-REFERENCE TO RELATED APPLICATION

This application claims priority and benefit under 35 U.S.C. § 119(e) of U.S. Provisional Patent Application Ser. No. 62/254,570, titled "Boot-Strapping Systems and Techniques for Circuits" and filed on Nov. 12, 2015, which is hereby incorporated by reference herein in its entirety.

FIELD OF INVENTION

The present disclosure relates generally to boot-strapping systems and techniques for circuits. Some implementations relate specifically to boot-strapping for switched regulation circuits implemented using core solid-state switches rather than I/O solid-state switches.

BACKGROUND

Voltage regulators can operate to provide a specified voltage level to a load by regulating a different voltage level (e.g., a power supply voltage level). One type of voltage regulator is the switching regulator. Switching regulators generally include one or more switches that control the amount of charge that is transferred from the power supply to the load or to a charge storage component (e.g., an inductor and/or capacitor). The power efficiency of switching regulators can be very high.

An integrated circuit (IC) can include one or more "core transistors" and one or more "input/output transistors" (I/O transistors). I/O transistors are generally capable of withstanding relatively large voltages, but can be slower and bulkier than core transistors. Core transistors are generally faster, smaller, and more power-efficient than I/O transistors, but can be incapable of withstanding relatively large voltage drops.

Capacitive circuit components (e.g., capacitors) are sometimes used to bias the voltage at the control terminal of a switch (e.g., the gate voltage of a metal-oxide-semiconductor field-effect transistor (MOSFET)). The use of such capacitive components to bias the voltage at a switch's control terminal may be referred to as "boot-strapping." In some circuits, boot-strapping is used to bias a switch's control terminal to a voltage that is greater than the circuit's power supply voltage. Boot-strapping circuits generally charge the capacitive components periodically or intermittently to counteract the capacitive component's tendency to lose its charge over time.

SUMMARY OF THE INVENTION

Many electronic devices have integrated circuits (ICs) that are powered by regulated low voltage DC power sources, which are often generated by dedicate power source regulator circuits that use a higher voltage input. As electronic devices become more sophisticated and compact, improvements in the size, performance, and efficiency (e.g., power efficiency) of the dedicated power regulator circuits are needed. High-speed switching regulators can be used to reduce the size and cost of power regulators, while improving performance and efficiency. However, conventional switching regulators generally use I/O transistors to withstand the higher voltage of the device's voltage source. The use of I/O transistors limits the switching speed and power efficiency of conventional switching regulators.

The present disclosure describes switching regulators that use core transistors to withstand the voltage of a power regulator's high-voltage power source. In some embodiments, the switching regulators described herein may exhibit higher switching speeds and greater power efficiency than conventional switching regulators. In some embodiments, the switching regulators include boot-strapping circuits, which may facilitate the switching regulators' proper operation and improved performance. Such boot-strapping circuits can be used in circuits other than switching regulators.

According to an aspect of the present disclosure, a power conversion circuit is provided. The power conversion circuit includes a supply terminal, a first solid-state switch, a second solid-state switch, a third solid-state switch, a fourth solid-state switch, an LC circuit, and a controller. The first solid-state switch has a pair of first switch terminals and a first control terminal. The pair of first switch terminals are coupled between the supply terminal and a first node. The second solid-state switch has a pair of second switch terminals and a second control terminal. The pair of second switch terminals are coupled between the first node and a second node. The third solid-state switch has a pair of third switch terminals and a third control terminal. The pair of third switch terminals are coupled between the second node and a third node. The fourth solid-state switch has a pair of fourth switch terminals and a fourth control terminal. The pair of fourth switch terminals are coupled between the third node and a ground terminal. The LC circuit includes a capacitor coupled between the first node and the third node, and an inductor coupled between the second node and a load. The controller is configured to transmit first, second, third, and fourth control signals to control the first, second, third, and fourth solid-state switches through the first, second, third, and fourth control terminals, respectively, to regulate a voltage at the load by repetitively (1) charging the capacitor causing a current to flow in the inductor and (2) discharging the capacitor causing current to flow in the inductor. The first, second, third, and/or fourth solid-state switch comprises one or more core transistors.

Other aspects and advantages of the invention will become apparent from the following drawings, detailed description, and claims, all of which illustrate the principles of the invention, by way of example only.

BRIEF DESCRIPTION OF THE DRAWINGS

Certain advantages of some embodiments of the present disclosure may be understood by referring to the following description taken in conjunction with the accompanying drawings. In the drawings, like reference characters generally refer to the same parts throughout the different views. Also, the drawings are not necessarily to scale, emphasis instead generally being placed upon illustrating principles of some embodiments of the invention.

FIG. 19A is a schematic of a driver circuit, according to some embodiments;

FIG. 19B is a schematic of another driver circuit, according to some embodiments;

FIG. 19C is a schematic of another driver circuit, according to some embodiments;

FIG. 19D is a schematic of another driver circuit, according to some embodiments;

FIG. 20A is a schematic of a boot-strapping switch, according to some embodiments; and FIG. 20B is a schematic of another boot-strapping switch, according to some embodiments.

DETAILED DESCRIPTION

Switching Regulator

Some embodiments relate to power regulator circuits. While some embodiments can be useful for a wide variety of power regulator circuits, some embodiments are particularly useful for power regulator circuits that can operate at relatively high frequencies and high efficiencies enabling the circuits to be completely contained on a unitary integrated circuit (IC) device adjacent to the load that it powers, as described in more detail below.

Figure 1:
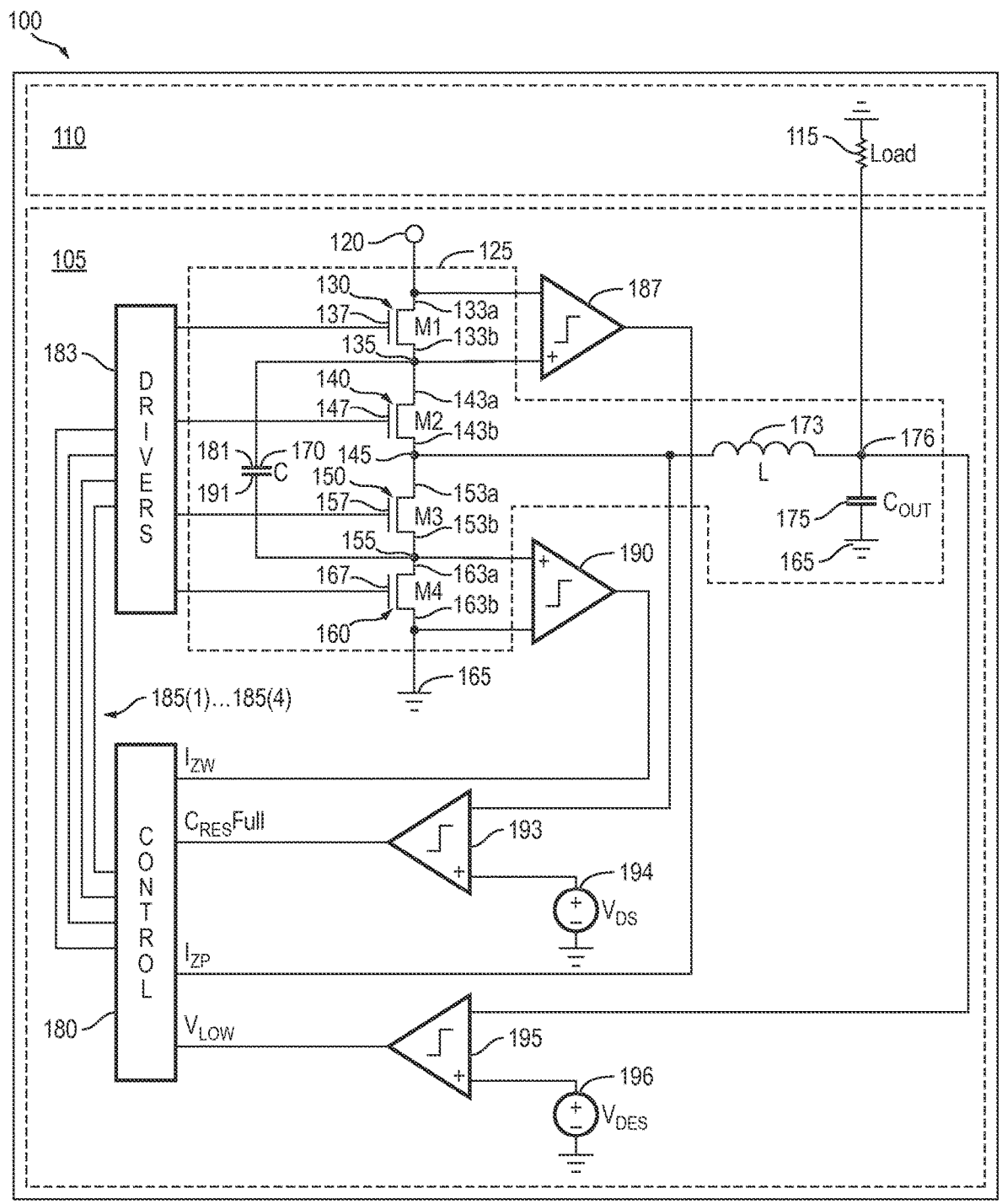
FIG. 1 is a schematic of a unitary die containing a power regulator portion and a load portion, according to some embodiments.

Now referring to FIG. 1 a non-limiting example block diagram of a power regulator circuit and a load integrated on a unitary IC device is illustrated. Unitary IC 100 may have a power regulator portion 105 and a load portion 110 monolithically integrated. Load portion 110 may perform any function including, but not limited to, a central processing unit, a graphics processing unit, an application processing unit, a display driver, or other function. Load portion 110 may be illustrated schematically by a load resistor 115.

Power regulator portion 105 may be configured to receive an input voltage from a first terminal 120 and supply a regulated output voltage to load 115. Power regulator portion 105 may have a switched regulation circuit 125 that is operated and controlled by one or more peripheral circuits, as discussed in more detail below.

Switched regulation circuit 125 may comprise four solid-state switches connected in series, an LC circuit and an output capacitor. More specifically, power regulation circuit 125 may be supplied with DC power through first terminal 120. A first solid-state switch 130 has a pair of first switch terminals 133a, 133b connected between first terminal 120 and a first junction 135, respectively. First solid-state switch 130 may also have a first control terminal 137 that may be used to transition the first solid-state switch between an on state and an off state, as discussed in more detail below.

A second solid-state switch 140 has a pair of second switch terminals 143a, 143b connected between first junction 135 and a second junction 145, respectively. Second solid-state switch 140 further has a second control terminal 147. A third solid-state switch 150 has a pair of third switch terminals 153a, 153b connected between second junction 145 and a third junction 155, respectively. Third solid-state switch further has a third control terminal 157. Fourth solid-state switch 160 has a pair of fourth switch terminals 163a, 163b connected between third junction 155 and a ground 165, respectively. Fourth solid-state switch 160 further has a fourth control terminal 167. An LC circuit includes a capacitor 170 connected between first junction 135 and third junction 155, and an inductor 173 connected between second junction 145 and load 115. In further embodiments, inductor 173 may be in series with capacitor 170. An output capacitor 175 is connected between inductor 173 and load 115 and coupled to ground 165. An output node 176, to which inductor 173, output capacitor 175 and load 115 are connected may be used to monitor an output voltage (Vout) of switched regulation circuit 125. For ease of identification, labels M1, M2, M3 and M4 may be used throughout this disclosure to identify first solid-state switch 130, second solid-state switch 140, third solid-state switch 150 and fourth solid-state switch 160, respectively. In some embodiments, the inductor 173 can be located between the capacitor 170 and either node 135 or node 155.

A controller is configured to receive inputs from the switched regulation circuit and control the operation of the solid state switches to provide a substantially constant output, as discussed in more detail below. Controller 180 may be coupled to driver circuits 183 with control lines 185(1) . . . 185(4) such that each control line controls the operation of one solid-state switch. In one embodiment, controller 180 may transmit high and low control signals through control lines 185(1) . . . 185(4) to operate a corresponding driver circuit 183. Driver circuits 183 may be coupled to first, second, third and fourth control terminals 137, 147, 157, 167, respectively of first, second, third and fourth solid state switches, 130, 140, 150, 160, respectively.

Driver circuits 183 may receive commands from controller 180 and control the operation of first, second, third and fourth solid state switches, 130, 140, 150, 160, respectively by sending signals through first, second, third and fourth control terminals 137, 147, 157, 167, respectively. Driver circuits 183 can have other functions, for example, converting the voltage level of the control circuitry to voltages for the drivers.

In some embodiments, controller 180 may regulate the voltage at output node 176 by controlling the first, second, third and fourth solid state switches, 130, 140, 150, 160, respectively, by repetitively (1) charging capacitor 170 causing a current to flow in inductor 173 and (2) discharging the capacitor causing current to flow in the inductor, as discussed in more detail below.

In some embodiments, one or more peripheral circuits may be employed individually or in combination with each other to aid controller 180 in operating switched regulation circuit 125. In one embodiment, a first comparator 187 may be connected from first terminal 120 to a first side 181 of capacitor 170 and be configured to compare the respective voltage levels. By comparing voltage levels, first comparator 187 may monitor the current flowing through first solid-state switch 130 (i.e., zero volts across the comparator equates to zero current flowing through first solid state switch). Similarly, second comparator 190 may be connected between ground 165 and a second side 191 of capacitor 170 and be configured to detect current flowing through fourth solid-state switch 160. Thus, first and second comparators 187, 190, respectively may be used to monitor current flowing through inductor 173 when first or fourth solid-state switches, 130, 160, respectively, are coupled in series with the inductor, as described in further detail below.

In another embodiment a third comparator 193 may be connected between second junction 145 and a first voltage source 194. In one embodiment first voltage source 194 may be a ground connection (i.e., having a potential of 0 volts). In some embodiments, a voltage level of first voltage source 194 may be used to create a timing offset for controller 180 to accommodate for delays in switch actuation. Third comparator 193 may be used to detect the voltage at second junction 145 when it is equivalent to the voltage of first voltage source 194 Similarly, fourth comparator 195 may be connected between output node 176 (Vout) and a second voltage source 196 such that it notifies controller 180 when it detects that Vout is equivalent to the second voltage source. Second voltage source 196 may also be adjusted to compensate for switch actuation delays. The combination of first, second, third and fourth comparators, 187, 190, 193, 195, respectively, may be used to aid controller 180 in detecting the current in inductor 173, the voltage across capacitor 170, and the voltage at output node 176 (Vout). In other embodiments different methods may be used to detect voltages and currents in switched regulation circuit 125. For example, in one embodiment a voltage across inductor 173 may be used to detect current in the inductor.

Although FIG. 1 illustrates a unitary IC 100 with all components integrated within the unitary IC, other embodiments may have the components disposed on more than one IC, while further embodiments may have one or more components that are not on an IC and disposed on circuitry adjacent the IC. For example, one embodiment may have output capacitor 175 or inductor 173 disposed adjacent one or more ICs. In other embodiments, one or more switches or drivers or control circuits may be on a separate IC.

Figure 2:
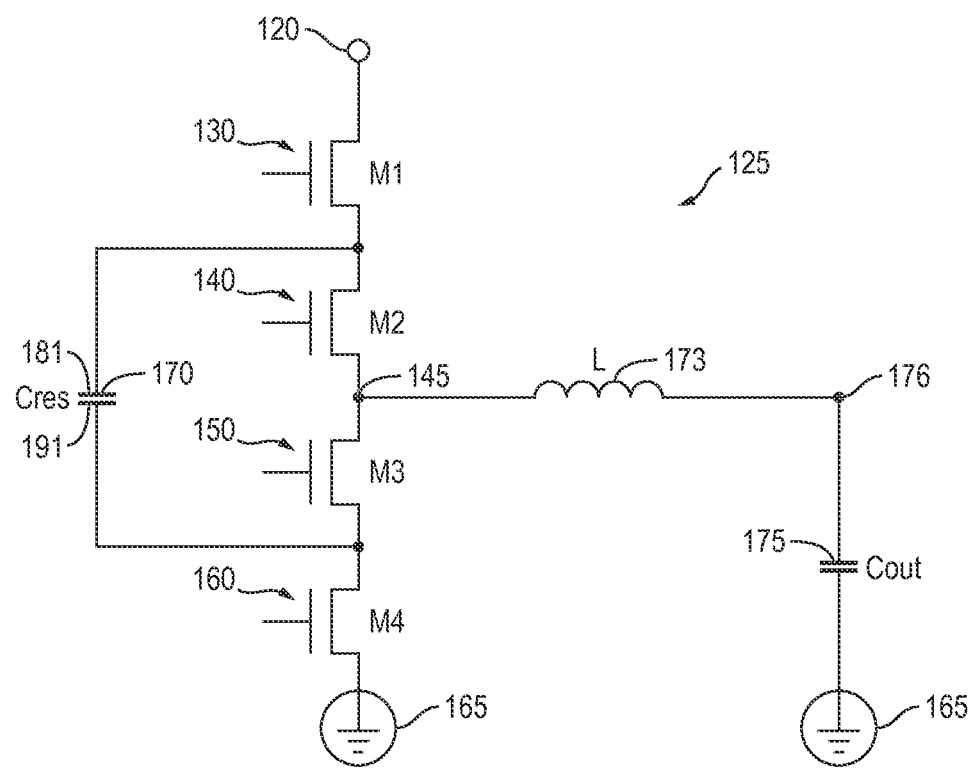
FIG. 2 is a schematic of the switched regulation circuit that has been removed from the power regulator portion of the schematic in FIG. 1.

Now referring to FIG. 2, for simplicity of illustration, switched regulation circuit 125 has been removed from power regulator portion 105 of unitary IC device 100 shown in FIG. 1. Switched regulation circuit 125 will be used to show the repetitive switching sequence used by the power regulator to control the voltage at output node 176 (Vout) delivered to load 115 (see FIG. 1).

Figure 3:
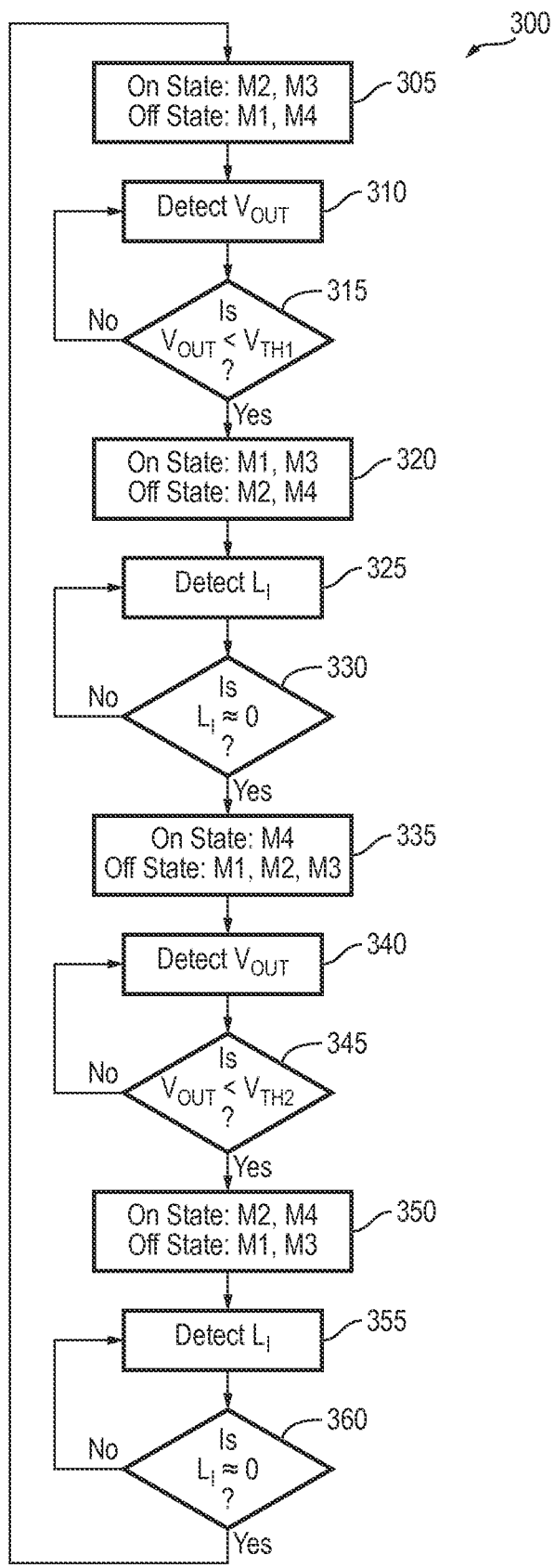
FIG. 3 is a flowchart of a repetitive switching sequence for the switched regulation circuit in FIG. 2, according to some embodiments.
Figure 6:
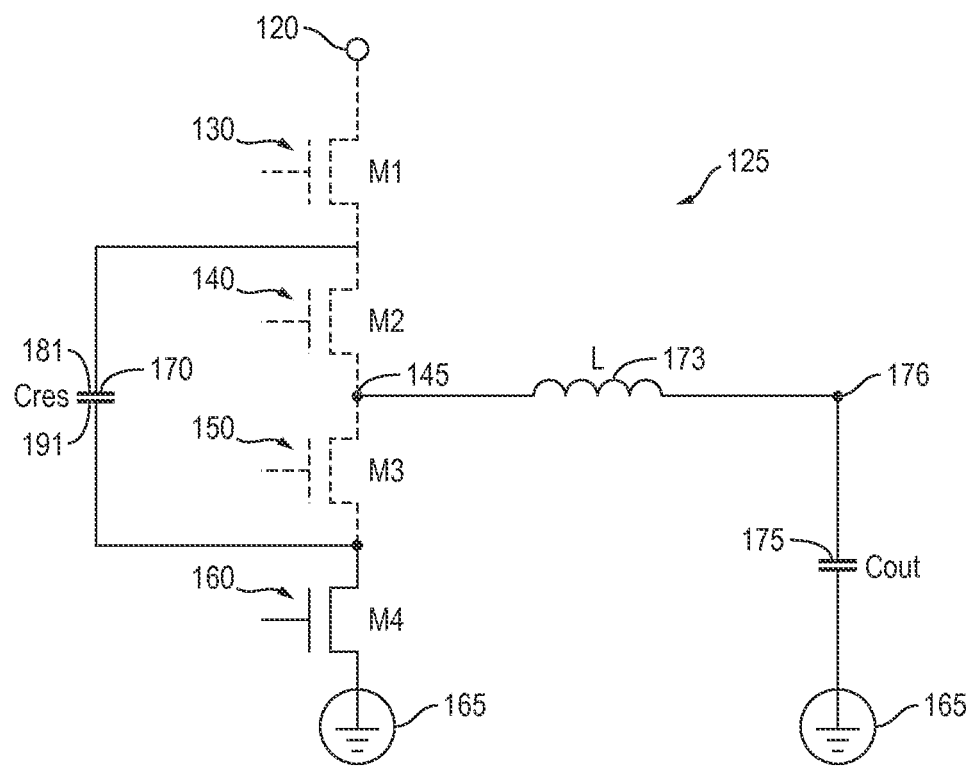
FIG. 6 is a schematic of the switched regulation circuit shown in FIG. 2 in a particular switch configuration according to the flowchart in FIG. 3.
Figure 7:
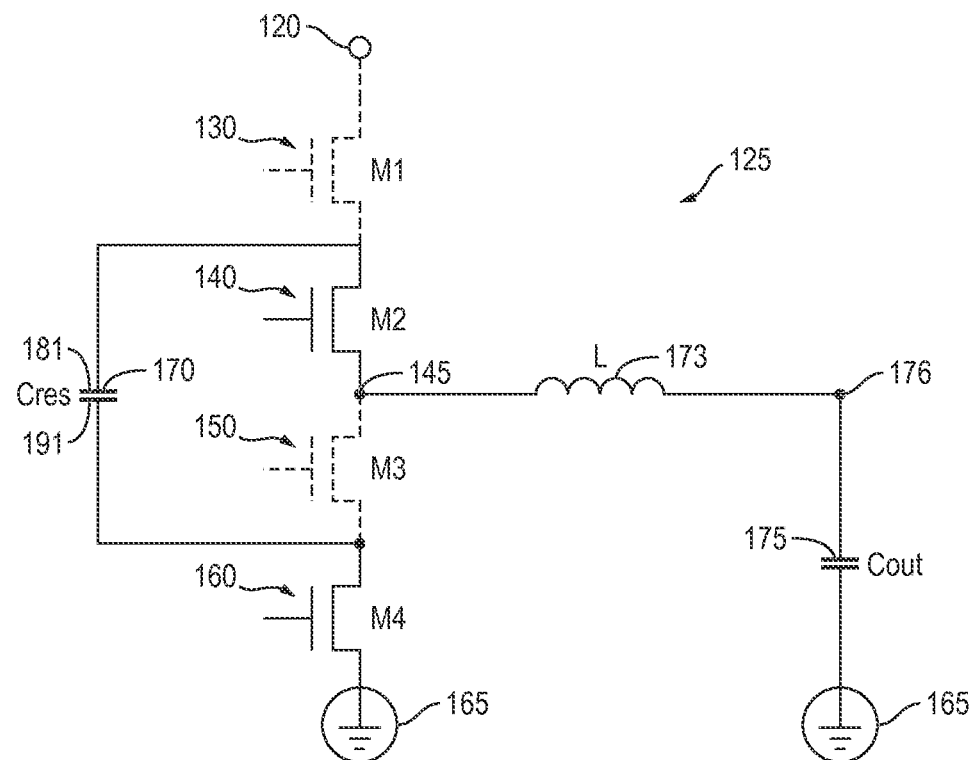
FIG. 7 is a schematic of the switched regulation circuit shown in FIG. 2 in a particular switch configuration according to the flowchart in FIG. 3.
Figure 8:
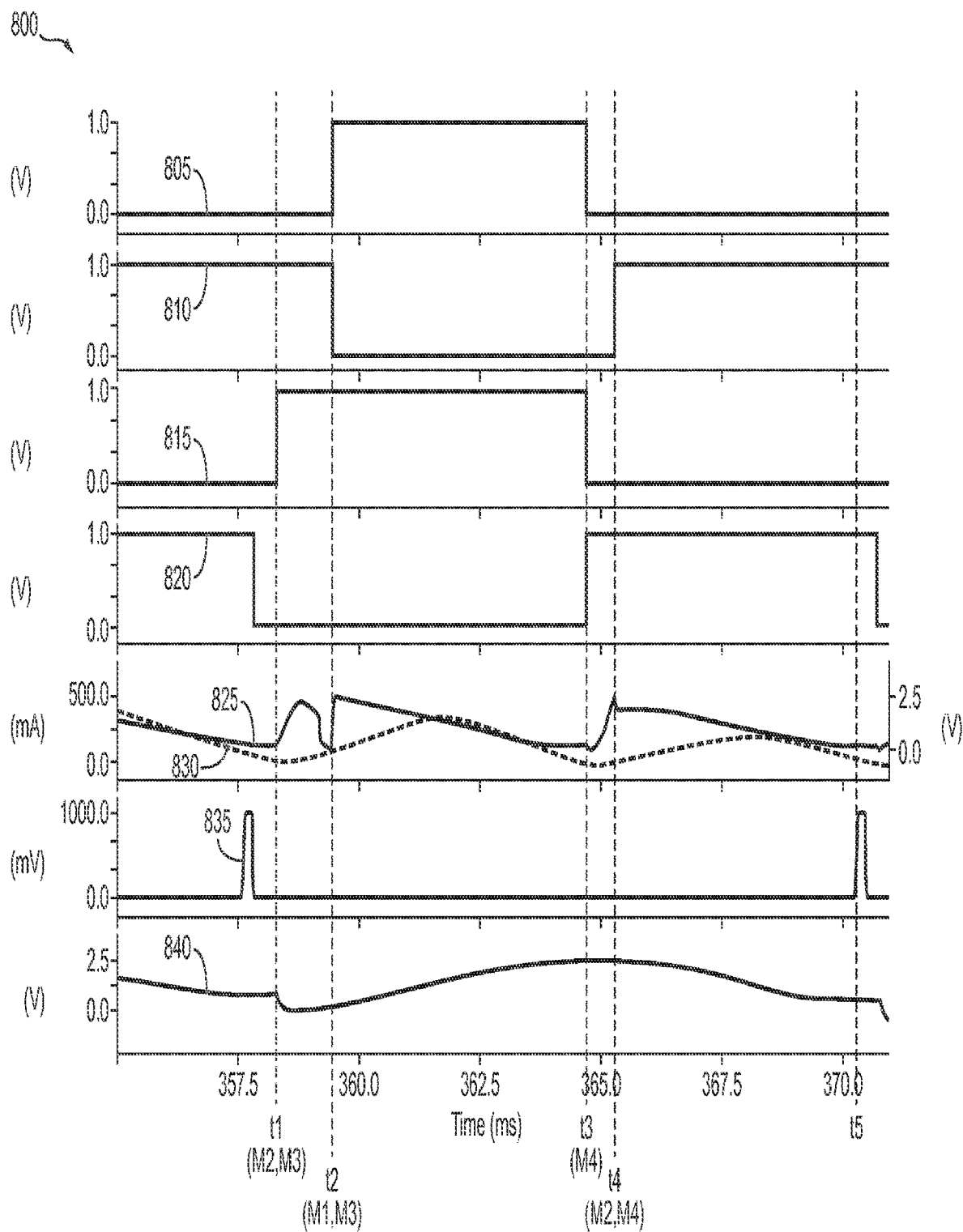
FIG. 8 is a timing diagram of voltages and currents within the switched regulation circuit of FIG. 2 according to the switching sequence in FIG. 3.

Now referring simultaneously to FIGS. 3-8 a first embodiment of a switching sequence and timing diagram for switched regulation circuit 125 is illustrated. FIG. 3 identifies four different solid-state switch configurations, the order in which the solid-state switches are turned on and off and the decisions between each step. FIGS. 4-7 illustrate simplified circuit schematics of each of the four different solid-state switch configurations. Solid-state switches in the on state are depicted with solid lines and solid-state switches that are in the off state are depicted with dashed lines. FIG. 8 illustrates an example timing diagram, showing the control signals delivered to each of the four solid-state switches as well as the voltage at second junction 145, the current within inductor 173, an inductor current comparator output and the voltage across capacitor 173. The switching sequence illustrated in FIGS. 3-8 is only an example and other sequences, timings and configurations are within the scope of this disclosure.

Figure 4:
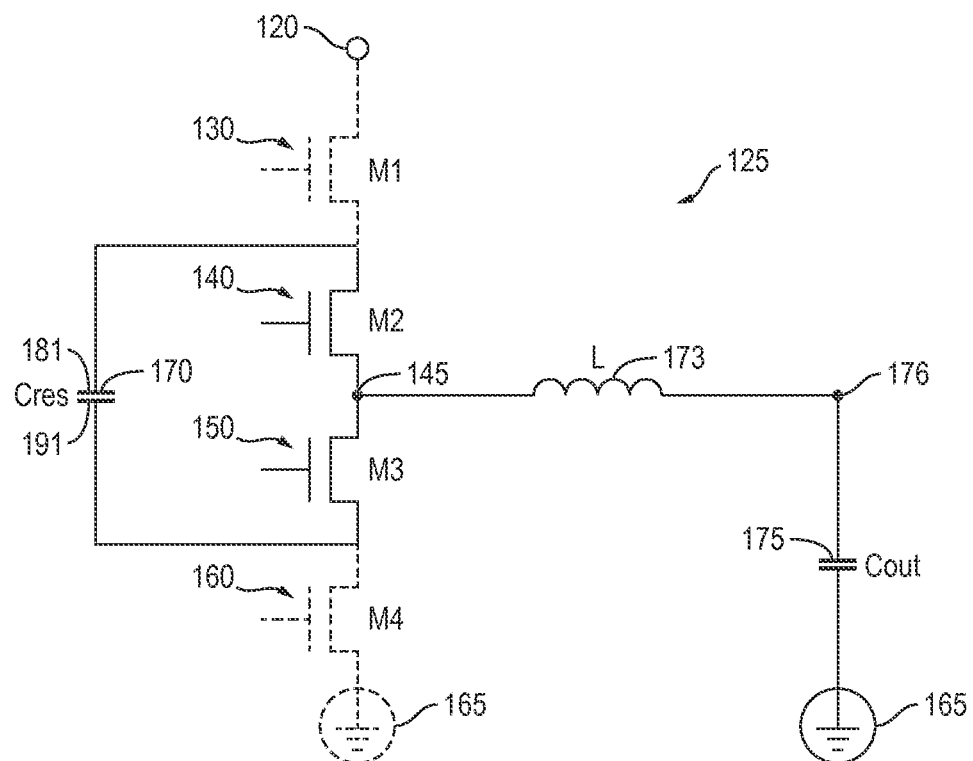
FIG. 4 is a schematic of the switched regulation circuit shown in FIG. 2 in a particular switch configuration according to the flowchart in FIG. 3.

Now referring to FIG. 3, a first switching sequence 300 having sequential steps 305 through 360 is illustrated. In step 305, second and third solid-state switches M2, M3, respectively, are controlled to be in an on state and first and fourth solid-state switches M1, M4 are controlled to be in an off state. A simplified schematic of switched regulation circuit 125 in step 305 is illustrated in FIG. 4. Second and third solid-state switches 140, 150, respectively are in an on state (solid lines) and first and fourth solid-state switches 130, 160, respectively are in an off state (dashed lines). Therefore, capacitor 170 is in a shorted condition, allowing any residual charge within the capacitor to dissipate such that the capacitor is discharged.

Now referring to timing diagram 800 in FIG. 8, first step 305 occurs at time t1. Trace 805 illustrates a control voltage applied to first solid-state switch 130. In the particular embodiment depicted in diagram 800, switches are turned on when approximately 1 volt is applied. At time t1 trace 805 is at approximately 0 volts thus first solid-state switch 130 is off. Trace 810 illustrates a control terminal voltage applied to second solid-state switch 140. At time t1 trace 810 is at approximately 1 volt thus second solid-state switch is on. Trace 815 illustrates a control terminal voltage applied to third solid-state switch 150. At time t1 trace 815 transitions to approximately 1 volt thus third solid-state switch 150 transitions from off to on. Trace 820 illustrates a control terminal voltage applied to fourth solid-state switch 160. At time t1 trace 820 is at approximately 0 volts thus fourth solid-state switch is off.

Trace 825 illustrates a voltage at second junction 145. At time t1, capacitor 170 is shorted. Trace 830 illustrates current through inductor 173. At time t1 inductor 173 is decoupled from the remainder of switched regulation circuit 125 thus the current in inductor 173 is zero. Trace 835 illustrates a comparator output corresponding to a zero current condition in inductor 173, as discussed in more detail below. Trace 840 illustrates the voltage across capacitor 170. At time t1 capacitor 170 is shorted causing the voltage across capacitor 173 to decrease as the capacitor is discharged.

Now referring back to FIGS. 3 and 4, after the controller sets the solid-state switches to their respective states identified in step 305, it advances to step 310 were it detects the voltage at output node 176 (Vout). In some embodiments Vout may be detected using comparator 195 (see FIG. 1) as discussed above, or by any other method. Advancing to step 315 the controller may detect if the voltage at output node 176 has decreased below a first threshold voltage ($V_{TH1}$). If Vout remains above $V_{TH1}$ then the controller continues to detect Vout (i.e., returns to step 310) until Vout drops below $V_{TH1}$. In some embodiments the controller may cyclically detect Vout then compare it to $V_{TH1}$, while in other embodiments the controller may respond to a signal, such as from a comparator, that Vout has decreased below $V_{TH1}$. Myriad methods may be used to detect Vout, compare it to $V_{TH1}$ and notify the controller.

Figure 5:
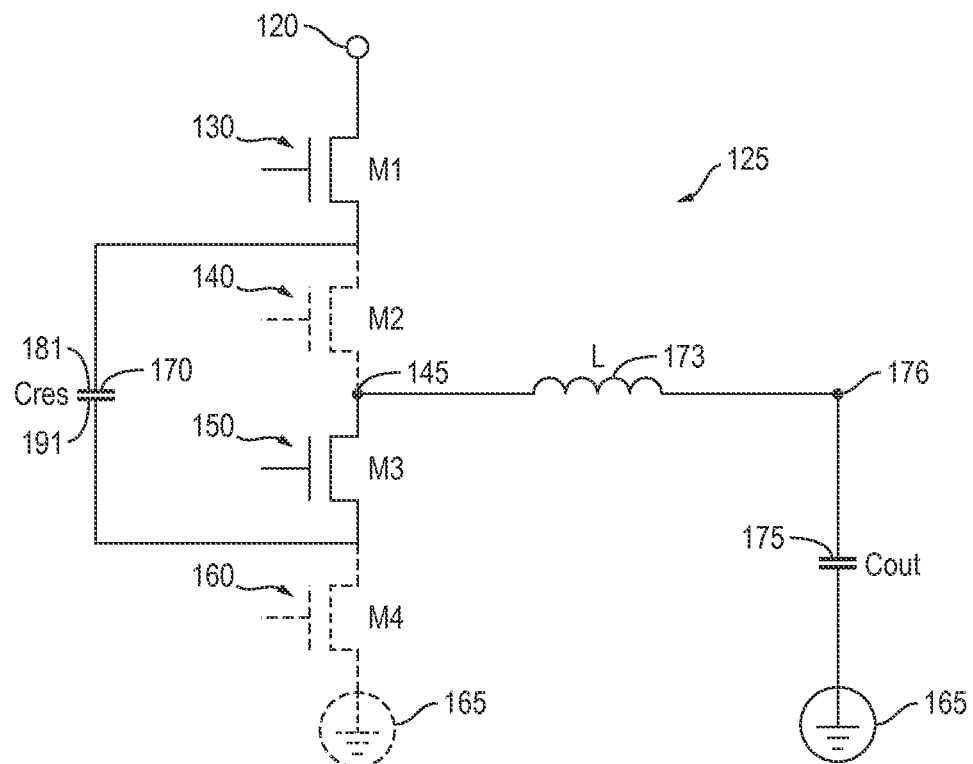
FIG. 5 is a schematic of the switched regulation circuit shown in FIG. 2 in a particular switch configuration according to the flowchart in FIG. 3.

Now referring back to FIG. 3, step 315, once Vout drops below $V_{TH1}$ the controller advances to step 320 where third solid-state switch M3 remains on while first solid-state switch M1 is turned on simultaneously with turning second solid-state switch M2 off. Thus, first and third solid-state switches, M1, M3, respectively, are on while second and fourth solid-state switches M2, M4, respectively, are off. A simplified schematic of switched regulation circuit 125 in step 320 is illustrated in FIG. 5. In this state the voltage at first terminal 120 (Vin) is applied directly to second junction 145. Capacitor 170 was fully discharged in the previous step and now begins to charge. Capacitor 170 charges with a time constant set by capacitor 170 and inductor 173 values. Further, as capacitor 170 begins to charge, current flow in inductor 173 increases as the voltage between 145 and the output is positive.

Step 320 is illustrated in timing diagram 800 (see FIG. 8) at time t2. Now referring simultaneously to FIGS. 5 and 8, at time t2, first solid-state switch 130 (i.e., trace 805) turns on almost simultaneously with second solid-state switch 140 (i.e., trace 810) turning off. The voltage at second junction 145 (i.e., trace 825) increases rapidly to the voltage at first terminal 120 (Vin), in this application (or embodiment) approximately 2.5 volts. Between time t1 and t2 the voltage at second junction 145 may fluctuate at time t2, current in inductor 173 (i.e., trace 830) begins to increase. As capacitor 170 becomes charged (i.e., trace 840 approaches 2.5 volts), Voltage at 145 start to decrease. When the voltage at 145 goes below the load voltage 176, the current in inductor 173 (i.e., trace 830) starts to decrease. Thus, in step 320 capacitor 170 becomes charged, causing a current to flow in inductor 173, and increasing the voltage at output node 176 (Vout). The controller then proceeds to step 325 (see FIG. 3).

In step 325, the current in inductor 173 ($L_I$) is detected. In some embodiments the current may be detected as illustrated in FIG. 1 with comparator 187. In one embodiment comparator 187 monitors current flow through first solid-state switch 130 by comparing a voltage difference between first terminal 120 and first side 181 of capacitor 170. As the voltage difference decreases, the current commensurately decreases in both first solid-state switch 130 and inductor 173. Referring now to step 330 in FIG. 3, once current in inductor 173 is approximately equal to zero, the controller proceeds to step 335 where first and third solid-state switches M1, M3, respectively, turn off and fourth solid-state switch M4 turns on while second solid-state switch M2 remains off. As discussed above, since the transition to step 335 only occurs when the current in inductor 176 is approximately zero, the transition to step 335 may employ zero current switching of first solid-state switch M1. Zero current switching occurs when the current through the solid-state switch is approximately zero, before changing the state of the switch. This reduces switching losses, reduces input supply noise, and improves the efficiency of switched regulation circuit 125, as discussed in more detail below.

Continuing to refer to step 335 in FIG. 3, in some embodiments the switching transitions may occur simultaneously while in other embodiments there may be slight delays between switch transitions. A simplified schematic of switched regulation circuit 125 in step 335 is illustrated in FIG. 6. Fourth solid-state switch 160 ties second side 191 of capacitor 170 to ground, however first side 181 of the capacitor is left floating such that the capacitor remains charged. This configuration is essentially an off state, where the system is substantially at steady-state. Other embodiments may have a different off state configuration. In one embodiment, all solid-state switches may be in an off position, while in further embodiments third solid-state switch 150 may be the only switch in an on state which connects capacitor 170 to inductor 173. Other off state solid-state switch configurations are within the scope of this disclosure.

Step 335 of FIG. 3 is illustrated in timing diagram 800 of FIG. 8, at time t3. Now referring simultaneously to FIGS. 6 and 8, at time t3 first and third solid-state switches, 130, 150, respectively, turn off and fourth solid-state switch 160 turns on while second solid-state switch 140 remains off. After the switching transitions, second junction 145 (i.e., trace 825) is disconnected from the solid-state switches and its voltage starts to increase. Capacitor 170 (i.e., trace 840) remains charged and the current in inductor 173 (i.e., trace 830) remains near zero. In step 340 the voltage at output node 176 (Vout) may be detected with comparator 195 (see FIG. 1) as discussed above in step 310. In other embodiments, Vout may be detected using a different method. As shown in step 345, the controller advances to step 350 when Vout drops below a second threshold voltage ($V_{TH2}$).

Now referring to FIG. 3, step 350, fourth solid-state switch M4 remains on and second solid-state switch M2 is turned on while first and third solid-state switches M1, M3, respectively, remain off. A simplified schematic of switched regulation circuit 125 in step 350 is illustrated in FIG. 7. Capacitor 170 is connected between inductor 173 and ground 165, allowing the charge stored in the capacitor to discharge through the inductor to load 115 (see FIG. 1). As capacitor 170 begins to discharge (with a time constant set by capacitor 170 and inductor 173), current in inductor 173 starts to increase and voltage at output node 176 (Vout) increases. This condition is illustrated in timing diagram 800 in FIG. 8 at time t4.

Now simultaneously referring to FIGS. 7 and 8, at time t4 second solid-state switch 140 (i.e., trace 810) turns on. The voltage at second junction 145 (i.e., trace 825) makes an adjustment to approximately 2.5 volts as it is connected to fully charged capacitor 170. As capacitor 170 resonates with inductor 173, it discharges (i.e., trace 840) causing current to increase in inductor 173 (i.e., trace 830). This causes the voltage at Vout to increase. As the charge in capacitor 170 is reduced, current in inductor 173 decreases (i.e., trace 830). After configuring the solid-state switches, controller advances to steps 355 and 360 (see FIG. 3).

In step 355, the current in inductor 173 is detected. In some embodiments the current may be detected as illustrated in FIG. 1 with comparator 190. In further embodiments, comparator 190 (see FIG. 1) may be used to monitor the current through fourth semiconductor switch 160 and indirectly through inductor 173, by detecting a voltage differential between ground 165 and second side 191 of capacitor 170. For example, at time t5 in timing diagram 800 in FIG. 8, trace 835 illustrates a comparator output corresponding to a zero current condition in inductor 173. In other embodiments different methods may be used to detect current in inductor 173.

Referring now simultaneously to FIGS. 3 and 7, in step 360, once the current in inductor 173 is approximately equal to zero, the controller proceeds back to step 305, where third solid-state switch M3 is turned on and second solid-state switch M2 remains on while first solid-state switch M1 remains off and fourth solid-state switch M4 is turned off. Thus, M2 and M3 are on while M1 and M4 are off. This configuration shorts capacitor 170, repeating the entire switching sequence 300. As discussed above, since the current in inductor 173 and fourth solid-state switch M4 is at or near zero during the transition from step 360 to 305, zero current switching methods may be used to decrease switching losses, reduce input supply noise and improve efficiency, as discussed in more detail below.

In the particular switching sequence illustrated in FIG. 3, each solid-state switch turns on and off only once during each repetitive switching cycle. Such a sequence may enable improved efficiency by minimizing switching losses. In other embodiments, different switching configurations and sequences may be used where one or more switches may be turned on and off more than once.

As discussed above in FIG. 1, power regulator portion 105 and a load portion 110 may be monolithically integrated on unitary IC 100. In one embodiment unitary IC 100 may comprise silicon and first, second, third and fourth solid-state switches 130, 140, 150, 160 may be junction gate field effect devices (JFETs) while in other embodiments they may be metal oxide semiconductor field-effect transistors (MOSFETs), bi-polar devices or any other type of solid-state transistor. In further embodiments other materials may be used for unitary IC 100 such as silicon-germanium, silicon-carbide, gallium-nitride, gallium-arsenide and other materials. In one embodiment, unitary IC 100 may use a 28 nm and 40 nm fabrication process with an on die inductor in the range of 1-5 nH and an on die capacitor in the range of 100-300 pF, resulting in an on-time in the range of 1-5 ns.

Figure 9:
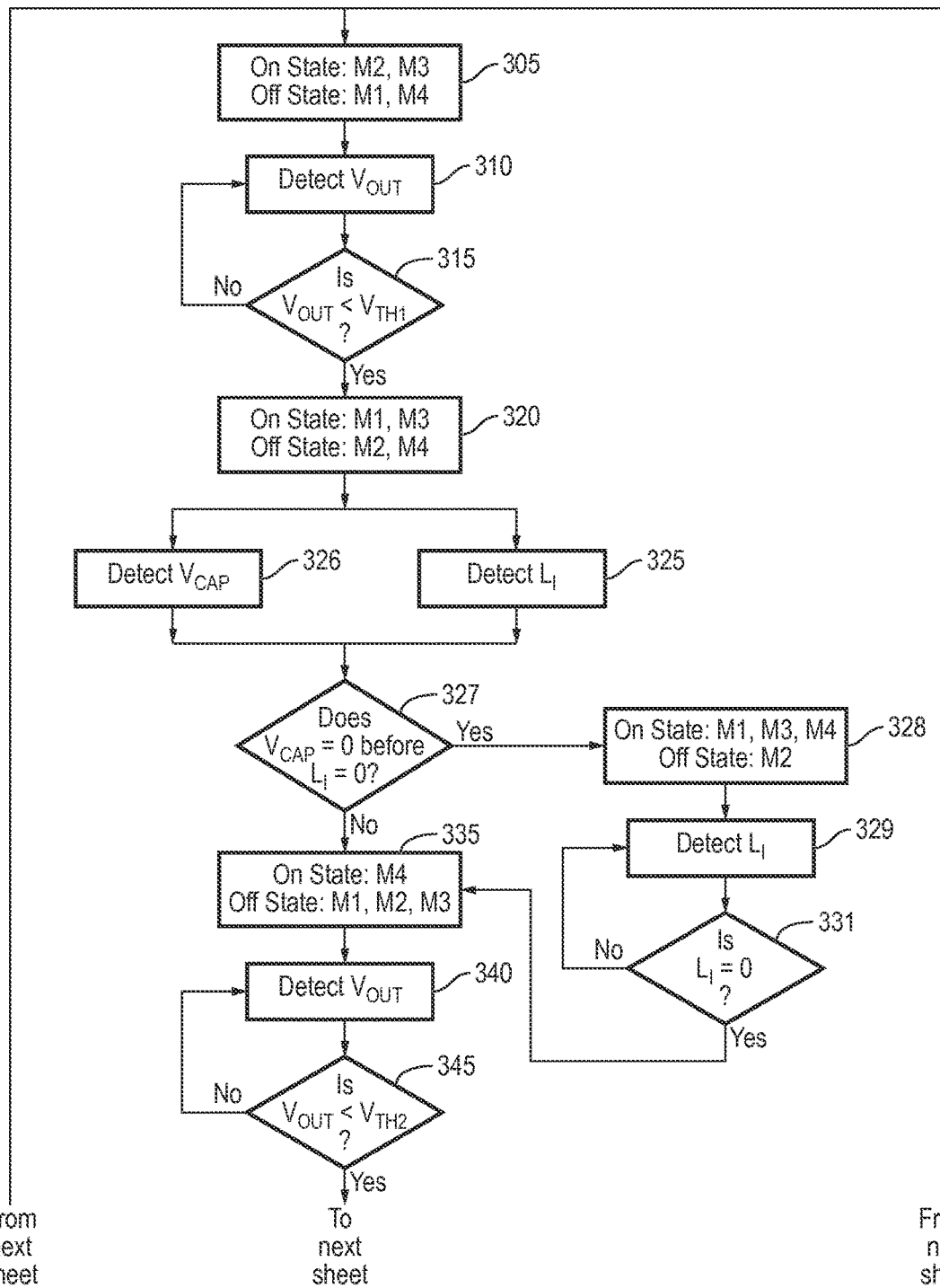
FIG. 9 is a is a flowchart of a repetitive switching sequence for the switched regulation circuit in FIG. 3 according to some embodiments.
Figure 9:
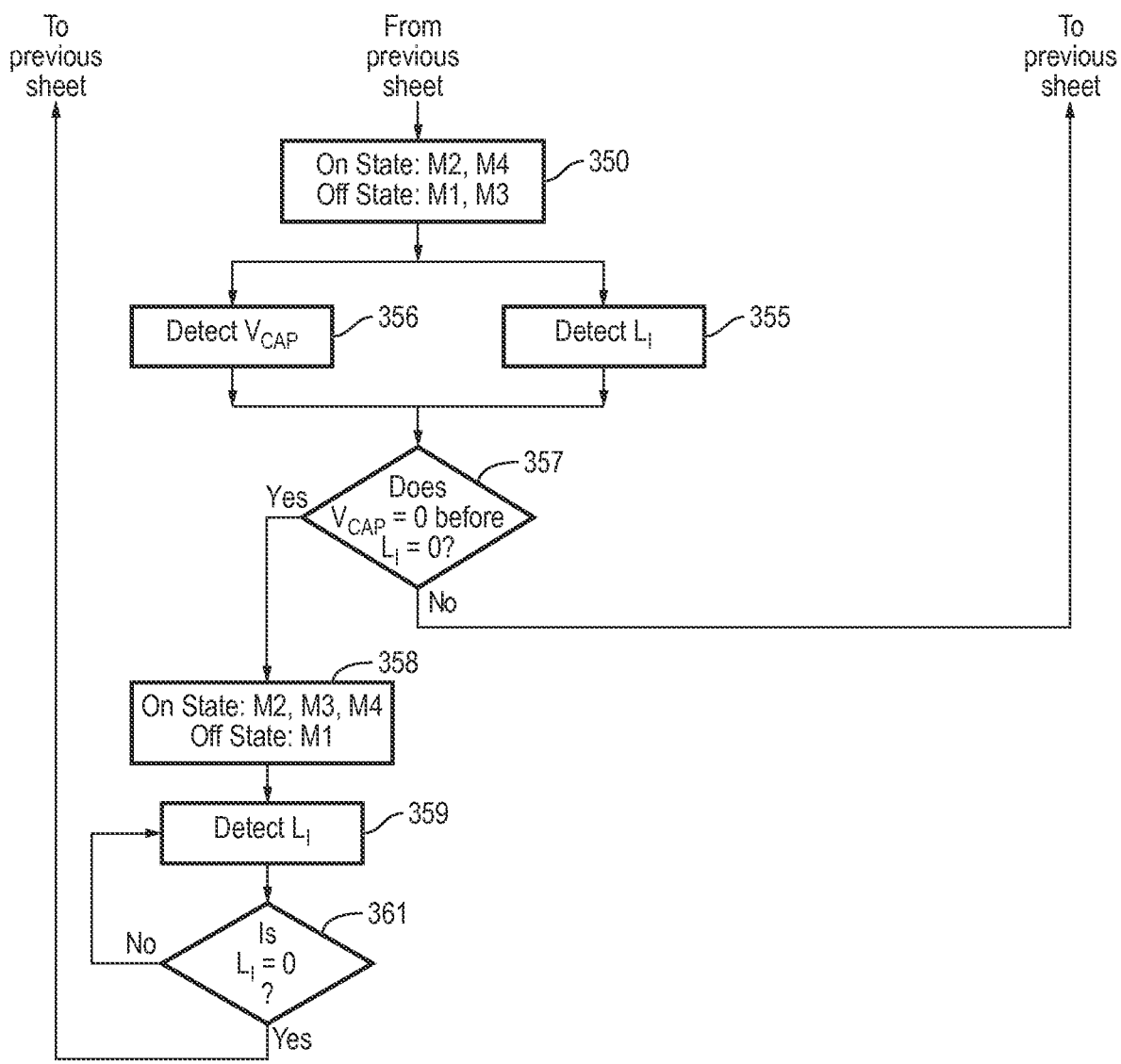
Figure 10:
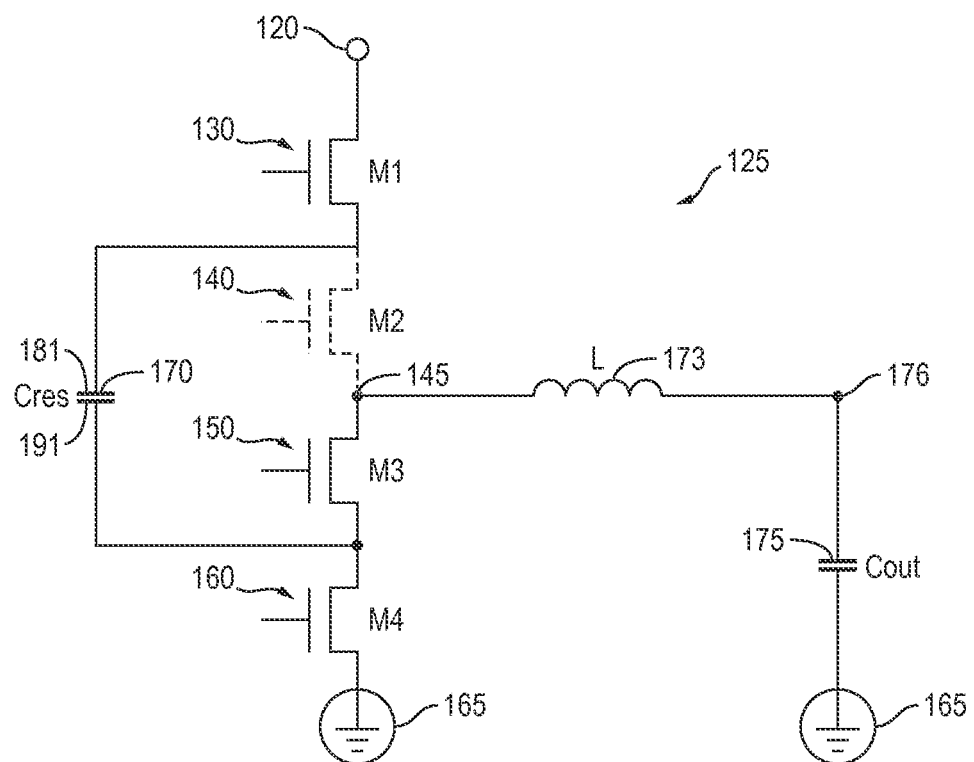
FIG. 10 is a schematic of the switched regulation circuit shown in FIG. 2 in a particular switch configuration according to the flowchart in FIG. 9.
Figure 11:
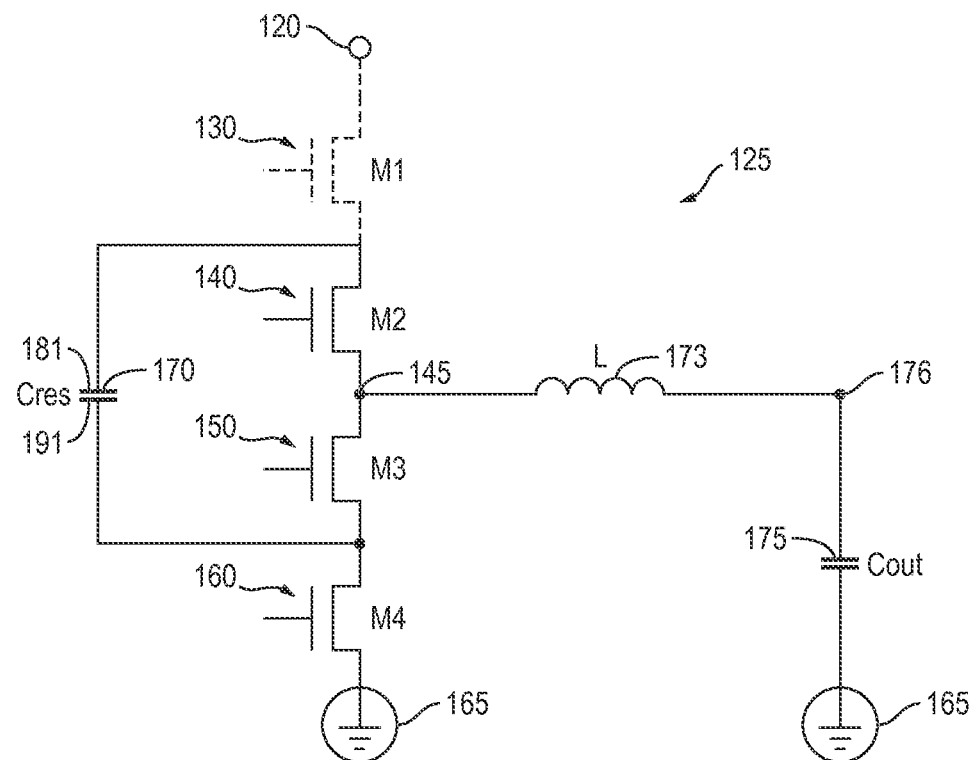
FIG. 11 is a schematic of the switched regulation circuit shown in FIG. 2 in a particular switch configuration according to the flowchart in FIG. 9.

Now referring to FIG. 9 another embodiment of a sequential switching sequence 900 is illustrated. Sequence 900 has many similar steps as sequence 300 in FIG. 3 such as steps 305-325 and 335-355. Thus steps that are the same between the sequences use the same reference numbers and the same schematics in FIGS. 4-7. However, sequence 900 has added steps including two added switch configurations, steps 328 and 358, the schematics for which are illustrated in FIGS. 10 and 11. Reference will now be made simultaneously to FIGS. 4-7 and 9-11.

Now referring to FIG. 9, a second switching sequence 900 having sequential steps 305 through 361 is illustrated. In step 305, second and third solid-state switches M2, M3, respectively, are controlled to be in an on state and first and fourth solid-state switches M1, M4 are controlled to be in an off state. A simplified schematic of switched regulation circuit 125 in step 305 is illustrated in FIG. 4. Second and third solid-state switches 140, 150, respectively are in an on state (solid lines) and first and fourth solid-state switches 130, 160, respectively are in an off state (dashed lines). Therefore, capacitor 170 is in a shorted condition, allowing any residual charge within the capacitor to dissipate such that the capacitor is discharged.

Now referring back to FIGS. 3 and 4, after the controller sets the solid-state switches to their respective states identified in step 305, it advances to step 310 were it detects the voltage at output node 176 (Vout). In some embodiments the voltage at output node 176 (Vout) may be detected using comparator 195 (see FIG. 1) as discussed above, or by any other method. Advancing to step 315 the controller may detect if the voltage at output node 176 has decreased below a first threshold voltage (VTH 1). If Vout remains above $V_{TH1}$ then the controller continues to detect Vout (i.e., returns to step 310) until Vout drops below $V_{TH1}$. In some embodiments the controller may cyclically detect Vout then compare it to $V_{TH1}$, while in other embodiments the controller may respond to a signal, such as from a comparator, that Vout has decreased below $V_{TH1}$ and respond accordingly. Myriad methods may be used to detect Vout, compare it to $V_{TH1}$ and notify the controller.

Now referring back to FIG. 9, step 315, once Vout drops below $V_{TH1}$ the controller advances to step 320 where third solid-state switch M3 remains on while first solid-state switch M1 is turned on simultaneously with turning second solid-state switch M2 off. Thus, first and third solid-state switches, M1, M3, respectively, are on while second and fourth solid-state switches M2, M4, respectively, are off. A simplified schematic of switched regulation circuit 125 in step 320 is illustrated in FIG. 5. In this state the voltage at first terminal 120 (Vin) is applied directly to second junction 145. Capacitor 170 was fully discharged in the previous step and now begins to charge. Capacitor 170 charges with a time constant set by capacitor 170 and inductor 173 values. Further, as capacitor 170 begins to charge, current flow in inductor 173 increases then decrease.

In some embodiments, steps 325 and 326 may occur simultaneously using one or more comparators or other techniques, as discussed in more detail below. In step 325, the current in inductor 173 ($L_I$) is detected. In some embodiments this may be performed as illustrated in FIG. 1 with comparator 187. In one embodiment comparator 187 monitors current flow through first solid-state switch 130 by comparing a voltage difference between first terminal 120 and first side 181 of capacitor 170. As the voltage difference decreases, the current commensurately decreases in both first solid-state switch 130 and inductor 173. In step 326 the voltage drop across capacitor 170 ($V_{CAP}$) is detected, using one or more comparators, as discussed above. More specifically the controller is configured to continue charging the capacitor until a voltage potential on the second junction is approximately 0 volts. In step 327 the controller determines if the voltage on capacitor ($V_{CAP}$) 170 is zero volts before current in inductor 173 is zero. More specifically, during steps 320, 325, 326 and 327, capacitor 170 is being charged and once it reaches full charge (i.e., voltage on capacitor 170 is zero) the controller determines if there is still current flowing in inductor 170. If there is still current in inductor 170, the controller proceeds to step 328, however it there is no current in the inductor then it proceeds to step 335.

Proceeding now to step 328, assuming the condition $L_I>0$ when $V_{CAP}=0$, first and third solid-state switches M1, M3 remain on while fourth solid-state switch M4 is turned on simultaneously with turning second solid-state switch M2 off. Thus, first, third and fourth solid-state switches, M1, M3 and M4, respectively, are on while second solid-state switch M2 is off. In some embodiments, M4 may be turned on slowly so that the current in M1 is slowly reduced so as to reduce the amount of supply noise. A simplified schematic of switched regulation circuit 125 in step 328 is illustrated in FIG. 10. In this state inductor 173 is shorted to ground 165, resulting in a rapid discharge of any remaining current within it. After configuring the solid-state switches, controller advances to steps 355 and 360 (see FIG. 9).

In step 329, the current in inductor 173 is detected. In some embodiments the current may be detected as illustrated in FIG. 1 with comparator 190. In some embodiments, comparator 190 (see FIG. 1) may be used to monitor the current through fourth semiconductor switch 160 and indirectly through inductor 173, by detecting a voltage differential between ground 165 and second side 191 of capacitor 170. In other embodiments different methods may be used to detect current in inductor 173.

Referring now simultaneously to FIGS. 3 and 7, in step 331, once the current in inductor 173 is approximately equal to zero, the controller proceeds to step 335. In summary, steps 328, 329 and 331 discharge the remaining current in inductor 170 and transition to the waiting state in step 335.

Referring now back to step 327, assuming condition $L_I=0$ (i.e., there is no current in inductor 170), instead of going to step 328, the controller goes directly to step 335 where first and third solid-state switches M1, M3, respectively, turn off and fourth solid-state switch M4 turns on while second solid-state switch M2 remains off. Thus, M4 is on while M1, M2 and M3 are off. As discussed above, since the transition to step 335 only occurs when the current in inductor 176 is approximately zero, the transition to step 335 may employ zero current switching of first solid-state switch M1. Zero current switching occurs when the current through the solid-state switch is approximately zero, before changing the state of the switch. This reduces switching losses, reduces input supply noise and improves the efficiency of switched regulation circuit 125, as discussed in more detail below.

Continuing to refer to step 335 in FIG. 9, in some embodiments the switching transitions may occur simultaneously while in other embodiments there may be slight delays between switch transitions. A simplified schematic of switched regulation circuit 125 in step 335 is illustrated in FIG. 6. Fourth solid-state switch 160 ties second side 191 of capacitor 170 to ground, however first side 181 of the capacitor is left floating such that capacitor remains charged. This configuration is essentially an off state, where the system is substantially at steady-state. Other embodiments may have a different off state configuration. In one embodiment, all solid-state switches may be in an off position, while in further embodiments third solid-state switch 150 may be the only switch in an on state which connects capacitor 170 to inductor 173. Other off state solid-state switch configurations are within the scope of this disclosure.

After the switches are configured in step 335 the controller advances to step 340 where the voltage at output node 176 (Vout) may be detected with comparator 195 (see FIG. 1) as discussed above in step 310. In other embodiments, Vout may be detected using a different method. As shown in step 345, the controller advances to step 350 when the voltage at output node 176 (Vout) drops below a second threshold voltage ($V_{TH2}$).

Now referring to FIG. 9, step 350, fourth solid-state switch M4 remains on and second solid-state switch M2 is turned on while first and third solid-state switches M1, M3, respectively, remain off. A simplified schematic of switched regulation circuit 125 in step 350 is illustrated in FIG. 7. Capacitor 170 is connected between inductor 173 and ground 165, allowing the charge stored in the capacitor to discharge through the inductor to load 115 (see FIG. 1). As capacitor 170 begins to discharge (with a time constant set by capacitor 170 and inductor 173), current in inductor 173 starts to increase and voltage at output node 176 (Vout) increases.

In some embodiments, steps 355 and 356 may occur simultaneously. After configuring the solid-state switches, the controller advances to step 355 where the current in inductor 173 is detected and 356 where the voltage drop across capacitor 170 ($V_{CAP}$) is detected, as discussed above. More specifically, in one embodiment controller may continue discharging the capacitor until a voltage potential on the second junction is approximately 0 volts. Then, in step 357 the controller determines if the voltage across capacitor ($V_{CAP}$) 170 is zero volts before current in inductor 173 is zero. More specifically, during steps 350, 355, 356 and 357, capacitor 170 is being discharged and once it reaches near zero charge the controller determines if there is still current flowing in inductor 170. If there is no current in inductor 170, the controller proceeds back to the beginning of the switching sequence, step 305. However, if there is still current in inductor 170 then the controller proceeds to step 358.

Proceeding now to step 358, assuming the condition $L_I>0$ when $V_{CAP}=0$ volts (i.e., there is still current in the inductor when the capacitor is discharged), second and fourth solid-state switches M2, M4, respectively, remain on while third solid-state switch M3 is turned on and first solid-state switch M1 is off. Thus, second, third and fourth solid-state switches, M2, M3 and M4 respectively, are on while first solid-state switch M1 is off. A simplified schematic of switched regulation circuit 125 in step 358 is illustrated in FIG. 11. In this state inductor 173 is shorted to ground 165, resulting in a rapid discharge of any remaining current within it. After configuring the solid-state switches, controller advances to steps 359 and 361 (see FIG. 9).

In step 359, the current in inductor 173 is detected. In some embodiments the current may be detected as illustrated in FIG. 1 with comparator 190. In some embodiments, comparator 190 (see FIG. 1) may be used to monitor the current through fourth semiconductor switch 160 and indirectly through inductor 173, by detecting a voltage differential between ground 165 and second side 191 of capacitor 170. In other embodiments different methods may be used to detect current in inductor 173.

Referring now simultaneously to FIGS. 7 and 9, in step 361, once the current in inductor 173 is approximately equal to zero, the controller proceeds back to step 305, where third solid-state switch M3 is turned on and second solid-state switch M2 remains on while first solid-state switch M1 remains off and fourth solid-state switch M4 is turned off. Thus, M2 and M3 are on while M1 and M4 are off. This configuration shorts capacitor 170, repeating the entire switching sequence 900. As discussed above, since the current in inductor 173 and fourth solid-state switch M4 is zero during the transition from step 361 to 305, zero current switching methods may be used to decrease switching losses, reduce input supply noise and improve efficiency, as discussed in more detail below.

In the particular switching sequence illustrated in FIG. 9, each solid-state switch turns on and off only once during each repetitive switching cycle. Such a sequence may enable improved efficiency by minimizing switching losses. In other embodiments, different switching configurations and sequences may be used where one or more switches may be turned on and off more than once. Other embodiments may use switching sequences where one or more on the solid-state switches are turned on and off more than once per switching cycle.

Some embodiments may employ one or more comparators such as comparators 187, 190, 193, 195 in FIG. 1 to provide information to the controller to operate switched regulation circuit 125 (see FIG. 1). Further embodiments may use a combination of comparators and timers to operate switched regulation circuit 125. More specifically, with knowledge of certain switched regulation circuit 125 parameters reasonably accurate timers may be used in the place of comparators to trigger the controller to change switch configurations. In one embodiment, with knowledge of one or more electrical characteristics of switched regulation circuit 125, such as for example, Vin, Vout, inductance of inductor 17 or capacitance of capacitor 170, one or more timers may be used to estimate one or more electrical characteristics of the switched regulation circuit, such as for example current in inductor or voltage on capacitor, and trigger the transitions between switch configurations. In some embodiments, timers may be faster and easier to implement than comparators. In one embodiment, only one comparator may be used to look at Vout, and timers may be used for all other transitions.

As discussed above, in some switching transitions zero current switching may be used. As used herein, zero current switching means that the solid-state switch may be turned off only when the current running through the switch is at or near zero. Switching losses (i.e., turning a switch off while it is conducting current or turning a switch on when it has a voltage potential across it) may be a significant contributor to power loss in the system. Thus, the use of zero current switching may result in reduced switching losses, increased frequency of operation and in some embodiments, reduced electromagnetic interference (EMI) generation, as discussed in more detail below.

Figure 12:
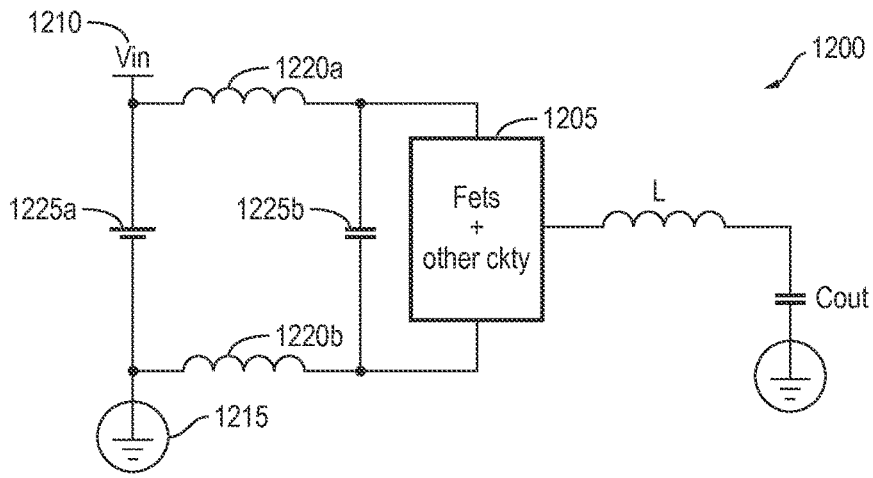
FIG. 12 is a schematic of a switched regulation circuit with parasitic elements, according to some embodiments.

Now referring to FIG. 12, in some embodiments zero current switching and the solid-state switching transition speed may be reduced to suppress input supply noise (i.e., a type of EMI) as described in more detail below. FIG. 12 shows a simplified schematic 1200 of a power regulator circuit 1205 containing FETs and other circuitry that is powered by an input supply 1210 (Vin) and grounded to a ground terminal 1215. In one embodiment, power regulator circuit 1205 may be disposed on a unitary die that is encapsulated in a semiconductor package. First and second inductors 1220a, 1220b, respectively, represent the parasitic inductance associated with the power connections to power regulator circuit 1205. Parasitic inductance may result from traces on a circuit board, interconnects within an electronic package, wire bonds to a die, traces on an integrated circuit or any other conductor. Capacitor 1225a represents parasitic capacitance between the power supply lines on the supply side and capacitor 1225b represents parasitic capacitance between the input and the output power supply lines on the receiving side.

During operation of power regulator circuit 1205, first and second parasitic inductors 1220a, 1220b, respectively, cannot immediately cease carrying current when the power regulator stops drawing current from input supply 1210 (Vin), such as for example when M1 (see FIG. 1) switches off. When M1 shuts off abruptly while carrying current, the residual energy within first and second parasitic inductors 1220a, 1220b, may ring with one or more components within power regulator circuit 1205.

To minimize or reduce the ringing (i.e., input supply noise), zero current switching may be used, where the current in first and second parasitic inductors 1220a, 1220b, respectively is brought to near zero before turning off M1. Such transitions are described in more detail above where current in the circuit may be detected and the switch is operated once the current has decayed to approximately zero. In other embodiments, the abrupt transition from carrying current through M1 to M1 opening and immediately ceasing carrying current may be slowed, by transitioning M1 slowly from the on state to the off state. More specifically, in one embodiment if there is residual current in inductor xxx, M4 may be turned on to dissipate the current in the inductor. However, if the current transitions too quickly from M1 to M4 noise may be created in the system. Thus, in some embodiments M4 may be turned on relatively slowly so the current may slowly transition from going through M1 to going through M4, creating a "quieter" switching transition. In one example embodiment, a transistor may be fabricated with a 28 nm process having a normal solid-state switching transition speed of approximately 10 ps. To reduce ringing, in one embodiment a slowed transition may be approximately ten times slower at 100 ps. In further embodiments the slowed transition may be between five times and fifteen times slower. In other embodiments, the slowed transition may be between 3 times and 17 times slower, as compared to a normal transition time. The slower transition turning M1 off may allow the current be slowly reduced in first and second parasitic inductors 1220a, 1220b, such that the ringing with on chip components is minimized or eliminated.

In further embodiments, zero current switching and the power regulation circuits disclosed herein may enable switching speeds that operate between 1 MHz and 500 MHz. In other embodiments the switching speed may be between 50 MHz and 200 MHz. In further embodiments the switching speed may be approximately 100 MHz.

Figure 13:
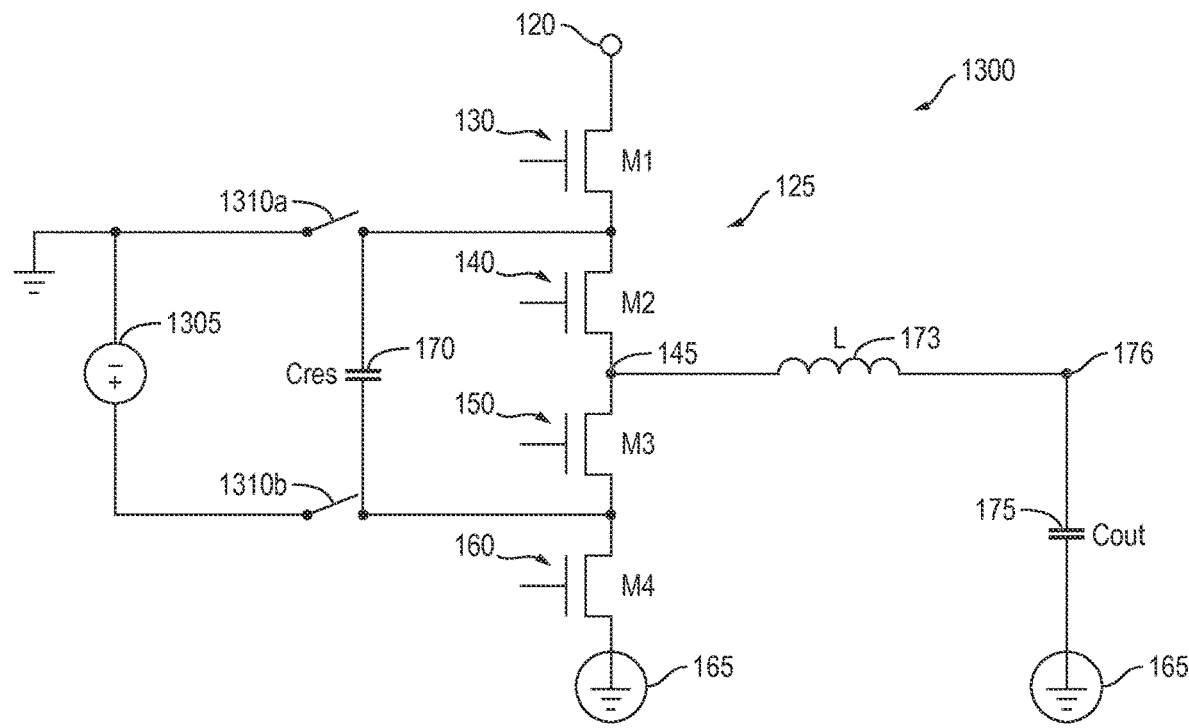
FIG. 13 is a schematic of the switched regulation circuit shown in FIG. 2 with an added power supply coupled to the circuit with a pair of switches according to some embodiments.

Now referring to FIG. 13, in further embodiments a boost circuit 1300 may be made by combining switched regulation circuit 125 with a power supply 1305 that is coupled to capacitor 170 with first and second solid-state switches 1310a, 1310b, respectively. In this embodiment capacitor 170 may be pre-charged by power supply 1305 such that when the capacitor is connected to input terminal 120 (Vin) it acts like a battery and increases or decreases the voltage potential supplied to switched regulation circuit 125. In one example embodiment, capacitor 170 may be pre-charged to −2 volts, such that when the switching sequence starts and the capacitor and inductor are connected to first terminal 120 (Vin) at 2.5 volts, a potential of 4.5 volts is applied to the capacitor and the inductor.

More specifically, referring to FIG. 3, step 305 and FIG. 9, step 305, instead of shorting capacitor 170 and completely discharging it, the capacitor may alternatively be coupled to power supply 1305 where it is pre-charged, such that in step 320 in FIGS. 3 and 9 when the capacitor is connected to Vin, the voltage applied to capacitor 170 and inductor 176 may be higher than Vin. In other embodiments the pre-charging may be used to increase the range of switched regulation circuit 125 when not operating under boost. Other configurations and variations of switched regulation circuit 125 and methods of pre-charging the capacitor are within the scope of this disclosure. For example, in one embodiment the power supply that is used for the pre-charging may be located on the same die as switched regulation circuit 125. In some embodiments the power supply may be a low drop out regulator, a switched capacitor or a switching regulator that are on the same die. In other embodiments the power supply may not be located on the same die as switched regulation circuit 125.

Switching Regulator with Core Solid-State Switches

Returning to FIGS. 1-2, in some embodiments each of the solid-state switches M1-M4 of the switched regulation circuit 125 can be implemented as a composite switch using one or more core transistors. The control terminals (137, 147, 157, 167) of the solid-state switches (M1, M2, M3, M4) may be driven by the controller 180. The description of solid-state switches M1-M4 below refers to a supply voltage ($V_{IN}$), a voltage ($V_{SS}$), and several intermediate voltages ($V_A$, $V_X$, $V_B$). In some embodiments, the supply voltage is provided at terminal 120 of the switched regulation circuit 125, and the $V_{SS}$ voltage corresponds to ground 165. In some embodiments, the intermediate voltages ($V_A$, $V_X$, $V_B$) are the voltages at the nodes identified by the corresponding labels ($V_A$, $V_X$, $V_B$) in FIG. 2.

Figure 14:
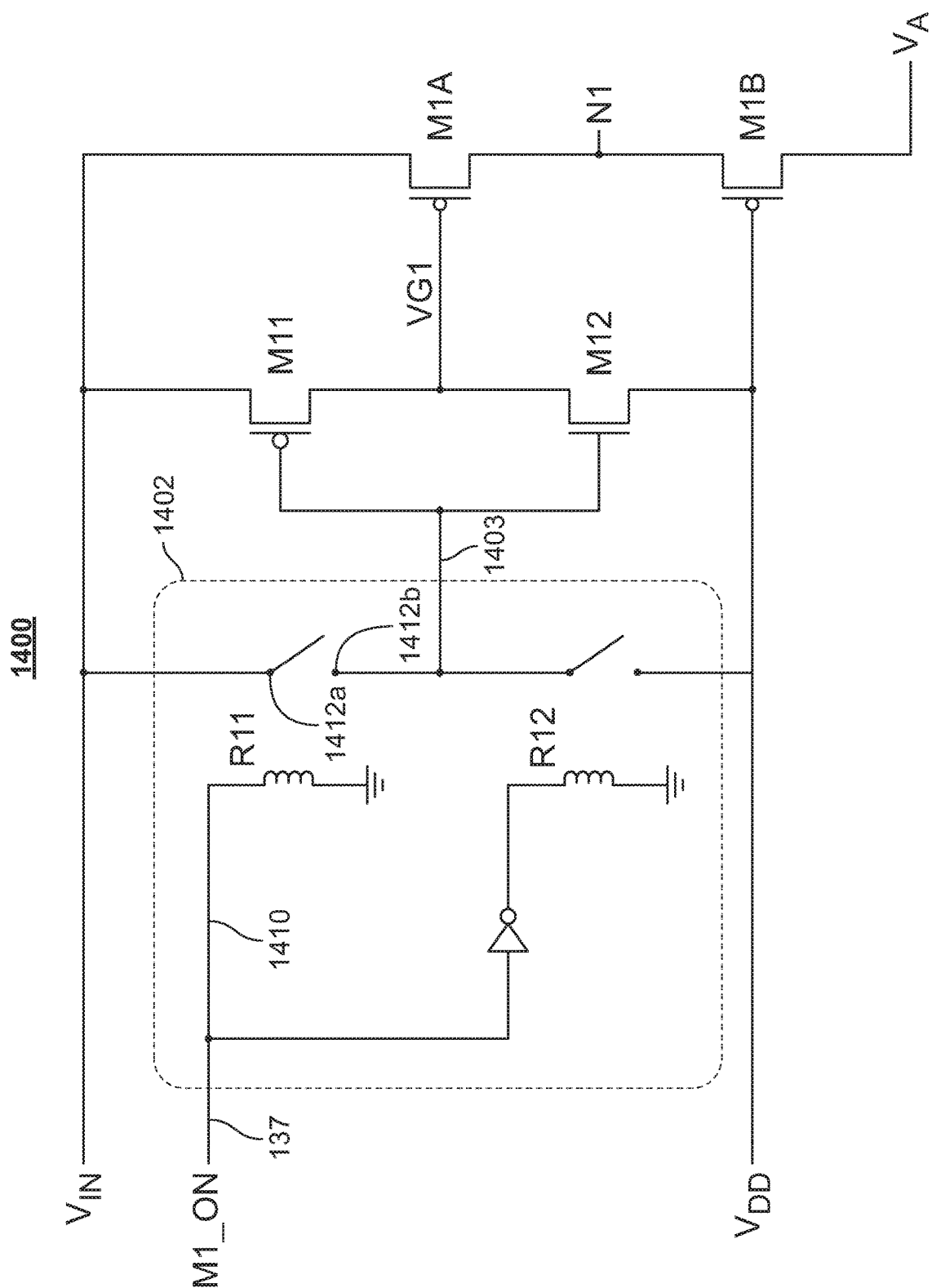
FIG. 14 is a schematic of a switching circuit, according to some embodiments.

FIG. 14 shows a schematic of a switching circuit 1400, according to some embodiments. In some embodiments, the solid-state switch M1 may be implemented using the switching circuit 1400.

The switching circuit 1400 includes transistors M1A, M1B, M11, and M12. The diffusion terminals of transistor M1A are coupled between a first supply terminal (which supplies a voltage $V_{IN}$) and a node (N1). The diffusion terminals of transistor M1B are coupled between the node (N1) and a node that supplies a voltage $V_A$. The diffusion terminals of the transistor M11 are coupled between the gate terminal (G1) of transistor M1A and the $V_{IN}$ supply terminal. The diffusion terminals of transistor M12 are coupled between transistor M1A's gate terminal and transistor M1B's gate terminal. The gates of M11 and M12 are coupled to each other. Transistor M1B's gate terminal is also coupled to a second supply terminal (which supplies a voltage $V_{DD}$).

In some embodiments, $V_{IN}$ is the I/O supply voltage for an integrated circuit (or portion thereof) that includes the switching circuit 1400. In some instances, $V_{IN}$ is approximately 1.8V. In some embodiments, $V_{DD}$ is approximately $0.5*V_{IN}$. Thus, the total voltage drop across the diffusion terminals of transistors M11 and M12 may be approximately $0.5*V_{IN}$. In some embodiments, $V_{DD}$ may be any voltage that satisfies the following condition: $V_{IN}-V_{DD}$>the nominal drain-source breakdown voltage of the integrated circuit's core transistors. In some embodiments, $V_A$ swings between $V_{IN}$ and $V_{SS}$ for the switching circuit 1400. Thus, the total voltage drop across the diffusion terminals of transistors M1A and M1B may be as high as approximately $V_{IN}$.

In some embodiments, one or more (e.g., all) of transistors M1A, M1B, M11, and M12 may be core transistors. A core transistor may not be capable of withstanding a voltage drop of approximately $V_{IN}$ Volts or greater across its diffusion terminals. For example, the drain-source breakdown voltage of a core transistor may be less than approximately $V_{IN}$ Volts. In some embodiments, the nominal maximum drain-source voltage of a core transistor may be approximately $0.5*V_{IN}$.

Returning to FIG. 14, the switching circuit 1400 also includes a driver circuit 1402, which drives the input 1403 of the inverter formed by M11 and M12 based on the control signal M1_ON. In some embodiments, the driver circuit 1402 includes switches R11 and R12. (As used herein, the 'relay switch' symbol used to depict switch R11 and other switches in FIGS. 14-17 represents any suitable switching device having a control terminal 1410 and switching terminals 1412*a* and 1412*b*.) The switching terminals of switch R11 are coupled between the $V_{IN}$ supply terminal and the gates of M11 and M12. The switching terminals of switch R12 are coupled between the $V_{DD}$ supply terminal and the gates of M11 and M12. The control terminal of R11 is coupled to control terminal 137 of the controller 180, which provides a signal M1_ON, and the control terminal of R12 is coupled to control terminal 137 through an inverter, which provides the inverse signal M1_ON'. As described below with reference to FIG. 19A, other implementations of the driver circuit 1402 are possible.

In operation, the controller 180 provides signal M1_ON using the above-described techniques. When signal M1_ON represents the logical value "1" ("L1"), M1A and M1B are conducting, and $V_A$ is pulled up to approximately $V_{IN}$. When signal M1_ON represents the logical value "0" ("L0"), M1A and M1B are non-conducting, and $V_A$ is determined (at least in part) by the states of the other solid-state switches M2-M4. The functionality of the components of the switching circuit 1400 is described in greater detail below.

When signal M1_ON represents L1, the driver circuit 1402 pulls the input 1403 of the inverter formed by M11 and M12 up to $V_{IN}$. (In the embodiment of the driver circuit shown in FIG. 14, when M1_ON represents L1, switch R11 is conducting, and switch R12 is non-conducting.) Thus, the gate of M11 is pulled up to $V_{IN}$. Since the source of M11 is also at $V_{IN}$, M11 is non-conducting. The gate of M12 is also pulled up to $V_{IN}$. Since the source of M12 is at $V_{DD}$ (which, for purposes of this example, is equal to $0.5*V_{IN}$), M12 is conducting. Thus, the gate of M1A is pulled down to $V_{DD}$. Since the source of M1A is at $V_{IN}$, M1A is conducting. The gate of M1B is at $V_{DD}$, and the source of M1B is at approximately $V_{IN}$ (minus any voltage drop across M1A). Thus, M1B is conducting.

When signal M1_ON represents L0, the driver circuit 1402 pulls the input 1403 of the inverter formed by M11 and M12 down to $V_{DD}$. (In the embodiment of the driver circuit shown in FIG. 14, when M1_ON represents L0, switch R11 is non-conducting, and switch R12 is conducting.) Thus, the gate of M12 is pulled down to $V_{DD}$. Since the source of M12 is also at $V_{DD}$, M12 is non-conducting. The gate of M11 is also pulled down to $V_{DD}$. Since the source of M11 is at $V_{IN}$, M11 is conducting. Thus, the gate of M1A is pulled up to $V_{IN}$. Since the source of M1A is also at $V_{IN}$, M1A is non-conducting. When M1A is non-conducting, M1B is also non-conducting.

Thus, M1A and M1B can be implemented using core transistors, even if $V_A$ swings rail to rail between the I/O supply rails, because M1A and M1B turn on and off together. Thus, the full rail voltage ($V_{IN}$) never drops across the individual diffusion terminals of either M1A or M1B. M11 and M12 can also be implemented using core transistors, because the maximum voltage drop across either of these transistors is $V_{IN}-V_{DD}$ (which equals $0.5*V_{IN}$, for purposes of this example). Likewise, switches R11 and R12 can be implemented using core transistors, because the maximum voltage drop across either of these switches is approximately $V_{IN}-V_{DD}$.

Figure 15:
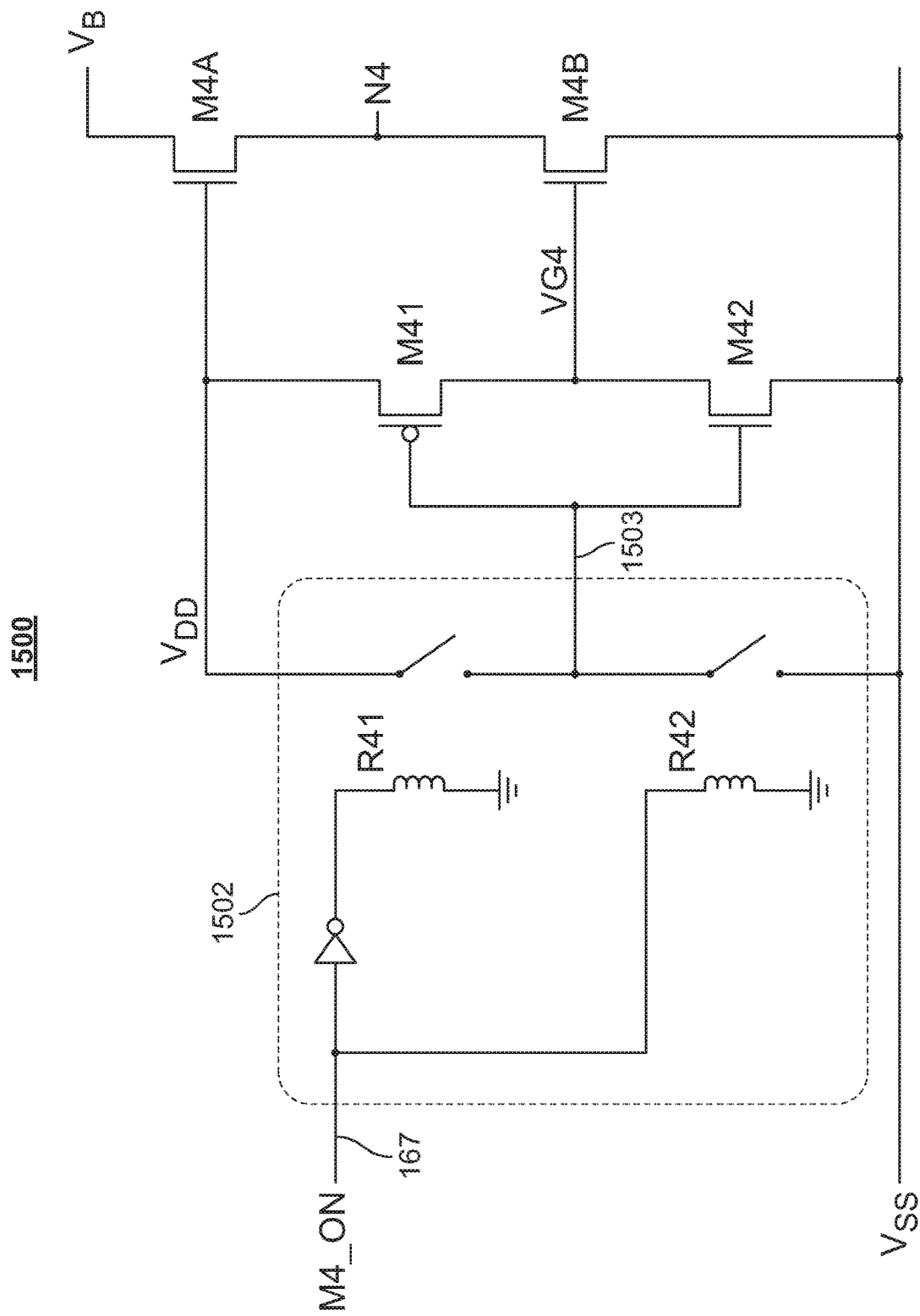
FIG. 15 is a schematic of another switching circuit, according to some embodiments.

FIG. 15 shows a schematic of another switching circuit 1500, according to some embodiments. In some embodiments, the solid-state switch M4 may be implemented using the switching circuit 1500.

The switching circuit 1500 includes transistors M4A, M4B, M41, and M42. The diffusion terminals of transistor M4A are coupled between the node that supplies voltage $V_B$ and a node (N4). The diffusion terminals of transistor M4B are coupled between the node (N4) and a reference terminal (which supplies voltage $V_{SS}$). The diffusion terminals of the transistor M41 are coupled between the gate terminal (G4) of transistor M4B and the gate terminal of transistor M4A. The diffusion terminals of transistor M42 are coupled between transistor M4B's gate terminal (G4) and the $V_{SS}$ terminal. The gates of M41 are M42 are coupled to each other, and transistor M4A's gate terminal is also coupled to the $V_{DD}$ supply terminal.

In some embodiments, $V_{DD}$ is approximately one-half the I/O supply voltage for an integrated circuit (or portion thereof) that includes the switching circuit 1500. Thus, the total voltage drop across the diffusion terminals of transistors M41 and M42 is approximately $V_{DD}$. In some embodiments, $V_B$ swings between the I/O supply voltage and $V_{SS}$ for the switching circuit 1500. Thus, the total voltage drop across the diffusion terminals of transistors M1A and M1B may be as high as approximately the I/O supply voltage. In some embodiments, one or more (e.g., all) of transistors M4A, M4B, M41, and M42 may be core transistors.

Returning to FIG. 15, the switching circuit 1500 also includes a driver circuit 1502, which drives the input 1503 of the inverter formed by M41 and M42 based on the control signal M4_ON. In some embodiments, the driver circuit 1502 includes switches R41 and R42. The switching terminals of switch R41 are coupled between the $V_{DD}$ supply terminal and the gates of M41 and M42. The switching terminals of switch R42 are coupled between the $V_{SS}$ terminal and the gates of M41 and M42. The control terminal of R41 is coupled to control terminal 167 of the controller 180 through an inverter, which provides a signal M4_ON', and the control terminal of R42 is coupled to the control terminal 167, which provides the inverse signal M4_ON. As described below with reference to FIG. 19B, other implementations of the driver circuit 1502 are possible.

In operation, the controller 180 provides signal M4_ON using the above-described techniques. When signal M4_ON represents L1, M4A and M4B are conducting, and $V_B$ is pulled down to approximately $V_{SS}$. When signal M4_ON represents L0, M4A and M4B are non-conducting, and $V_B$ is determined (at least in part) by the states of the other solid-state switches M1-M3. The functionality of the components of the switching circuit 1500 is described in greater detail below.

When signal M4_ON represents L1, the driver circuit 1502 pulls the input 1503 of the inverter formed by M21 and M22 down to $V_{SS}$. (In the embodiment of the driver circuit shown in FIG. 15, when M4_ON represents L1, switch R42 is conducting, and switch R41 is non-conducting.) Thus, the gates of M41 and M42 are pulled down to $V_{SS}$. Since the source of M42 is also at $V_{SS}$, M42 is non-conducting. Since the source of M41 is at $V_{DD}$ (which, for purposes of this example, is equal to one-half the I/O supply voltage), M41 is conducting. Thus, the gate of M4B is pulled up to $V_{DD}$. Since the source of M4B is at $V_{SS}$, M4B is conducting. The gate of M4A is also at $V_{DD}$, and the source of M4A is at approximately $V_{SS}$ (minus any voltage drop across M4B). Thus, M4A is conducting.

When signal M4_ON represents L0, the driver circuit 1502 pulls the input 1503 of the inverter formed by M21 and M22 up to $V_{DD}$. (In the embodiment of the driver circuit shown in FIG. 15, when M4_ON represents L0, switch R42 is non-conducting, and switch R41 is conducting.) Thus, the gates of M41 and M42 are pulled up to $V_{DD}$. Since the source of M41 is also at $V_{DD}$, M41 is non-conducting. Since the source of M42 is at $V_{SS}$, M42 is conducting. Thus, the gate of M4B is pulled down to $V_{SS}$. Since the source of M4B is also at $V_{SS}$, M4B is non-conducting. When M4B is non-conducting, M4A is also non-conducting.

Thus, M4A and M4B can be implemented using core transistors, even if $V_B$ swings rail to rail between the I/O supply rails, because M4A and M4B turn on and off together. Thus, the full rail voltage ($V_{IN}$) never drops across the individual diffusion terminals of either M4A or M4B. M41 and M42 can also be implemented using core transistors, because the maximum voltage drop across either of these transistors is $V_{DD}$ (which equals $0.5*V_{IN}$, for purposes of this example). Likewise, switches R41 and R42 can be implemented using core transistors, because the maximum voltage drop across either of these switches is approximately $V_{DD}$.

Figure 16:
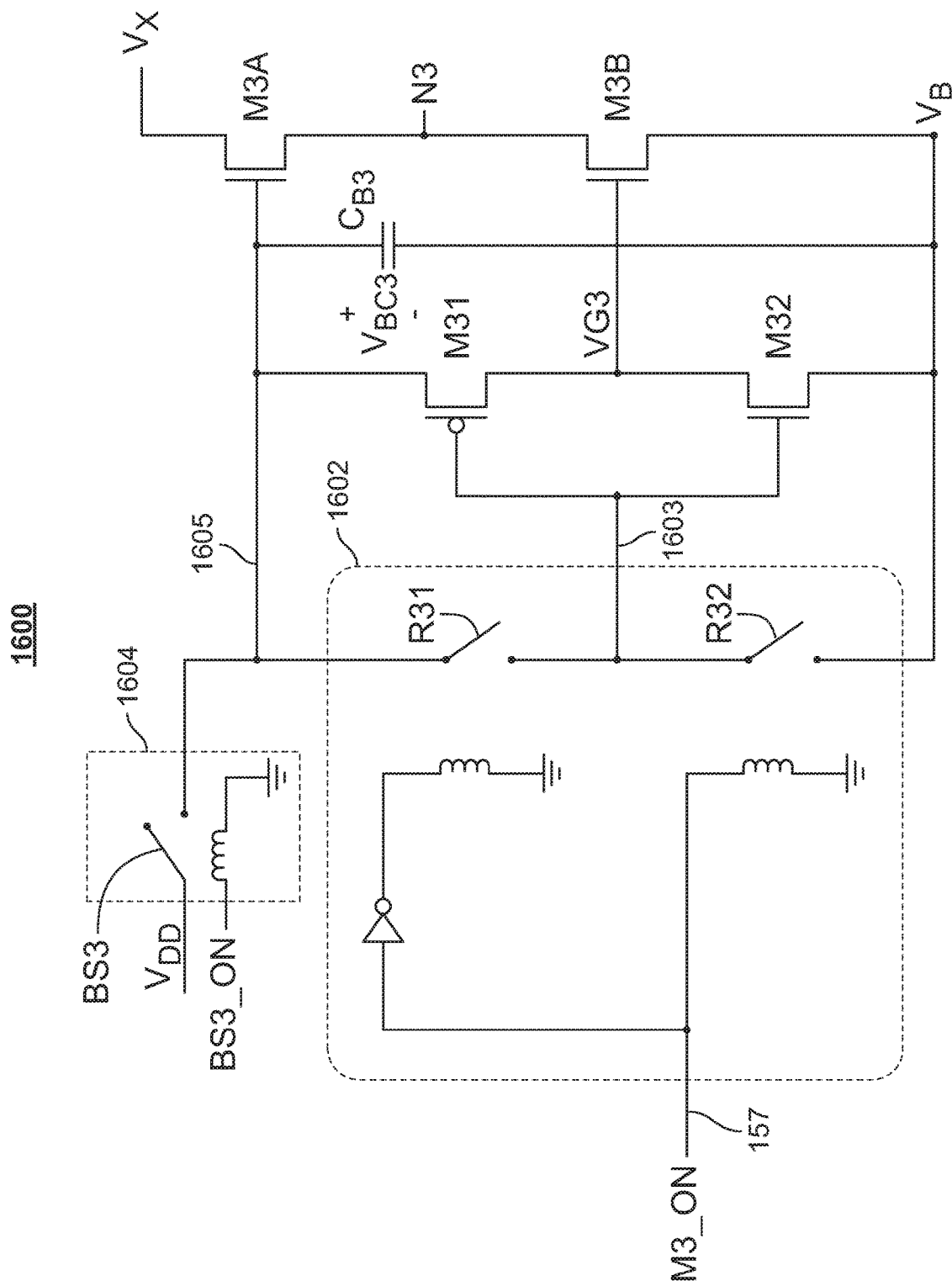
FIG. 16 is a schematic of another switching circuit, according to some embodiments.

FIG. 16 shows a schematic of another switching circuit 1600, according to some embodiments. In some embodiments, the solid-state switch M3 may be implemented using the switching circuit 1600.

The switching circuit 1600 includes transistors M3A, M3B, M31, and M32. The diffusion terminals of transistor M3A are coupled between the node that supplies voltage $V_X$ and a node (N3). The diffusion terminals of transistor M3B are coupled between the node (N3) and the node that supplies voltage $V_B$. The diffusion terminals of the transistor M31 are coupled between the gate terminal (G3) of transistor M3B and the gate terminal of transistor M3A. The diffusion terminals of transistor M32 are coupled between transistor M3B's gate terminal (G3) and the $V_B$ terminal. The gates of M31 are M32 are coupled to each other, and transistor M3A's gate terminal is also coupled to the $V_{DD}$ supply terminal (through a boot-strap switch BS3, which is described below).

In some embodiments, $V_{DD}$ is approximately one-half the I/O supply voltage for an integrated circuit (or portion thereof) that includes the switching circuit 1600, and $V_X$ and $V_B$ can swing between the I/O supply voltage and $V_{SS}$ for the switching circuit 1600. Thus, the maximum magnitude of the total voltage drop across the diffusion terminals of transistors M31 and M32 is approximately $|V_{DD}-V_B|=V_{DD}$. The magnitude of the total voltage drop across the diffusion terminals of transistors M1A and M1B may be as high as approximately $|V_X-V_B|$=the I/O supply voltage. In some embodiments, one or more (e.g., all) of transistors M3A, M3B, M31, and M32 may be core transistors.

Returning to FIG. 16, the switching circuit 1600 also includes a driver circuit 1602, which drives the input 1603 of the inverter formed by M31 and M32 based on the control signal M3_ON. In some embodiments, the driver circuit 1402 includes switches R31 and R32. The switching terminals of switch R31 are coupled between the $V_{DD}$ supply terminal (through the boot-strap switch BS3) and the gates of M31 and M32. The switching terminals of switch R32 are coupled between the $V_B$ node and the gates of M31 and M32. The control terminal of R31 is coupled to control terminal 157 of the controller 180 through an inverter, which provides a signal M3_ON', and the control terminal of R32 is coupled to the control terminal 157, which provides the inverse signal M3_ON. As described below with reference to FIG. 19C, other implementations of the driver circuit 1602 are possible.

As can be seen in FIG. 16, the switching circuit 1600 includes a boot capacitor ($C_{B3}$) coupled between the $V_B$ node and the second supply terminal ($V_{DD}$), such that the boot capacitor ($C_{B3}$) is coupled across M31 and M32. The charging and discharging of the boot capacitor $C_{B3}$ is controlled by a boot-strapping switch 1604 based on a control signal BS3_ON. In some embodiments, the boot-strapping switch 1604 includes a switch BS3, which has switching terminals coupled between (1) the $V_{DD}$ supply terminal and (2) M3A's gate and the boot capacitor $C_{B3}$. As will be described below, during operation of the switching circuit 1600, the maximum voltage $V_{CB3}$ across the boot capacitor $C_{B3}$ is approximately $V_{DD}$. As described below with reference to FIG. 20A, other implementations of the boot-strapping circuit 1604 are possible.

In operation, the controller 180 provides signal M3_ON using the above-described techniques. When signal M3_ON represents L1, M3A and M3B are conducting, and $V_X$ is pulled down to approximately $V_B$. When signal M3_ON represents L0, M3A and M3B are non-conducting, and $V_B$ and $V_X$ are determined (at least in part) by the states of the other solid-state switches M1, M2, and M4. The functionality of the components of the switching circuit 1600 is described in greater detail below.

When signal M3_ON represents L1, the driver circuit 1602 pulls the input 1603 of the inverter formed by M31 and M32 down to $V_B$. (In the embodiment of the driver circuit shown in FIG. 16, when M3_ON represents L1, switch R32 is conducting, and switch R31 is non-conducting.) Thus, the gates of M31 and M32 are pulled down to $V_B$. Since the source of M32 is also at $V_B$, M32 is non-conducting. The source of M31, by contrast, is at $V_B+V_{CB3}$, so M31 is conducting. Thus, the gate of M3B is pulled up to $V_B+V_{CB3}$. Since the source of M3B is coupled the $V_B$ node, the gate-source voltage of M3B is $V_{CB3}$, and M3B is conducting. The gate of M3A is also at $V_B+V_{CB3}$, and the source of M3A is coupled to the $V_B$ node through M3B, so the gate-source voltage of M3A is approximately $V_{CB3}$ (minus any voltage drop across M3B). Thus, M3A is conducting.

When signal M3_ON represents L0, the driver circuit 1602 pulls the input 1603 of the inverter formed by M31 and M32 up to the voltage of node 1605 ($V_B+V_{CB3}$). (In the embodiment of the driver circuit shown in FIG. 16, when M1_ON represents L0, switch R32 is non-conducting, and switch R31 is conducting.) Thus, the gates of M31 and M32 are pulled up to $V_B+V_{CB3}$. Since the source of M31 is also at $V_B+V_{CB3}$, M31 is non-conducting. Since the source of M32, by contrast, is at $V_B$, the gate-source voltage of M32 is $V_{CB3}$, and M32 is conducting. Thus, the gate of M3B is pulled down to $V_B$. Since the source of M3B is also at $V_B$, M3B is non-conducting. When M3B is non-conducting, M3A is also non-conducting.

Thus, M4A and M4B can be implemented using core transistors, even if $V_B$ and $V_X$ swing rail to rail between the I/O supply rails, because M3A and M3B turn on and off together. Thus, the full rail voltage ($V_{IN}$) never drops across the individual diffusion terminals of either M3A or M3B. M31 and M32 can also be implemented using core transistors, because the maximum voltage drop across either of these transistors is $V_{CB3}$ (which has a maximum magnitude of $V_{DD}$, for purposes of this example) or $|V_{DD}-V_B|$, which also has a maximum magnitude of $V_{DD}$. Likewise, switches R31 and R32 can be implemented using core transistors, because the maximum magnitude of the voltage drop across either of these switches is approximately $V_{DD}$.

The above-described operation of the switching circuit 1600 is dependent on the boot-strap capacitor $C_{B3}$ being charged to a suitable voltage $V_{CB3}$ at suitable times. For example, the switching circuit 1600 operates as described above if the voltage $V_{CB3}$ across the boot-strap capacitor $C_{B3}$ is maintained at approximately $V_{DD}$ during the switching circuit's operation.

The charging and discharging of the boot-strap capacitor $C_{B3}$ are controlled by the boot-strapping switch 1604. As can be seen in FIG. 16, when the boot-strapping switch decouples the boot-strap capacitor $C_{B3}$ from $V_{DD}$ (e.g., by opening switch BS3), the upper terminal of the capacitor $C_{B3}$ is floating, thereby facilitating maintenance of the capacitor's charge. When the boot-strapping switch couples the boot-strap capacitor $C_{B3}$ to $V_{DD}$ (e.g., by closing switch BS3), the upper terminal of the capacitor is coupled to the $V_{DD}$ terminal, and the lower terminal of the capacitor is coupled to the $V_B$ node. Thus, the capacitor $C_{B3}$ charges (or discharges) to approximately $V_{DD}-V_B$. The voltage across capacitor $C_{B3}$ can therefore be set to approximately $V_{DD}$ by closing the switch BS3 when the value of $V_B$ is approximately 0 Volts. As described above with reference to FIG. 15, the $V_B$ node is pulled down to $V_{SS}$ (by definition, 0 Volts) when the gate voltage ($V_{G4}$) of transistor M4B is pulled up to $V_{DD}$, which occurs shortly after signal M4_ON switches to L1. Thus, in some embodiments, the control terminal BS3_ON of the boot-strapping switch 1604 may be coupled to the gate of M4B, or to control terminal 167 (on which the controller 180 provides the M4_ON signal).

In some embodiments, the boot switch BS3 is implemented using core transistors. During operation of the switching circuit 1600, the maximum voltage across BS3's switching terminals is approximately $V_B+V_{BC3}-V_{DD}=V_B=$the I/O supply voltage. Thus, the boot switch BS3 can be implemented using two or more core transistors in a cascode configuration, an I/O transistor, or any other suitable component(s).

Figure 17:
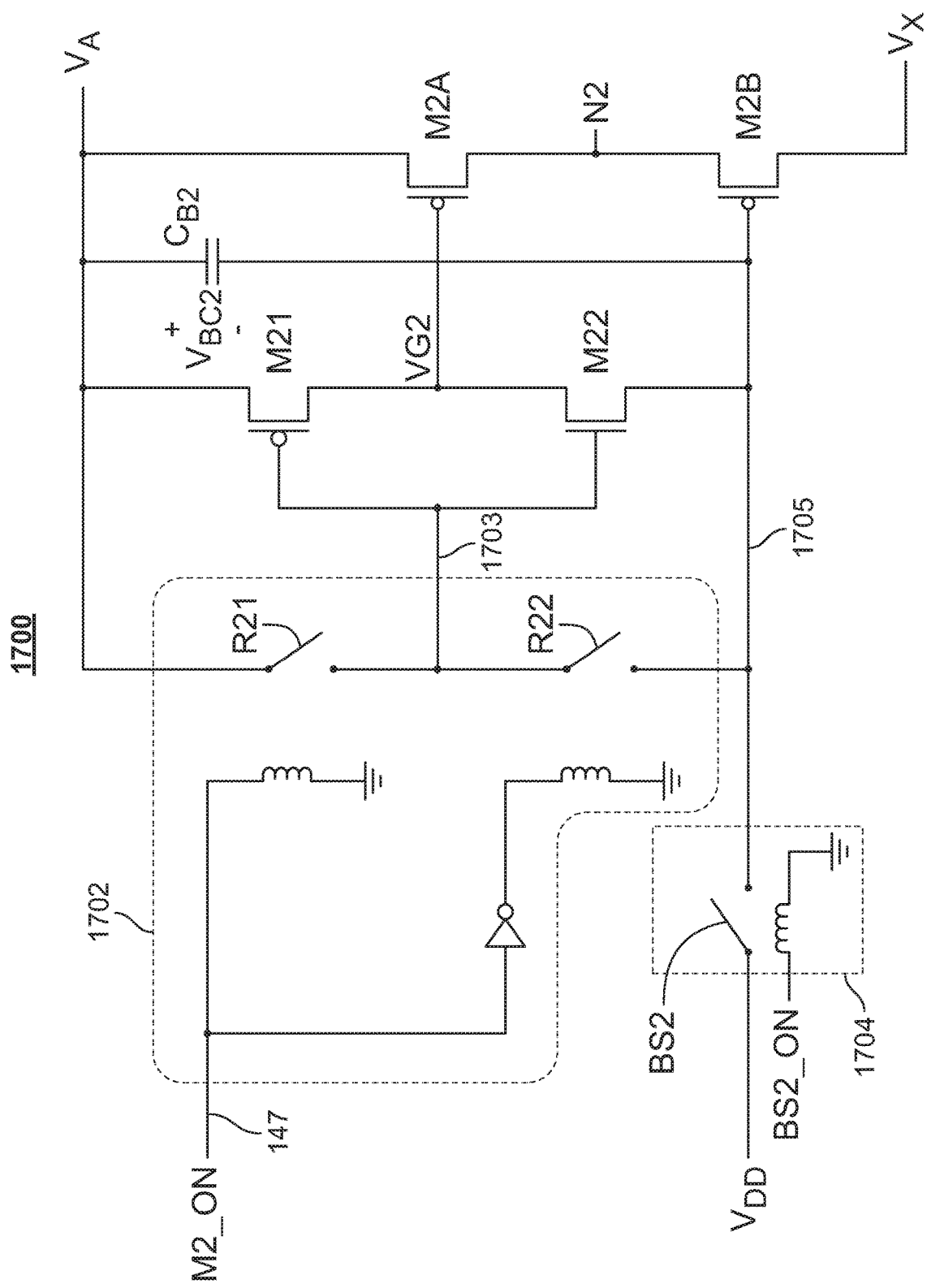
FIG. 17 is a schematic of another switching circuit, according to some embodiments.

FIG. 17 shows a schematic of another switching circuit 1700, according to some embodiments. In some embodiments, the solid-state switch M2 may be implemented using the switching circuit 1700.

The switching circuit 1700 includes transistors M2A, M2B, M21, and M22. The diffusion terminals of transistor M2A are coupled between and a node (N2) and the node that supplies voltage $V_A$. The diffusion terminals of transistor M2B are coupled between node N2 and the node that supplies voltage $V_X$. The diffusion terminals of the transistor M21 are coupled between the gate terminal (G2) of transistor M2A and the $V_A$ node. The diffusion terminals of transistor M22 are coupled between transistor M2A's gate terminal and transistor M2B's gate terminal. The gates of M21 and M22 are coupled to each other. Transistor M2B's gate terminal and one of transistor M22's diffusion terminals are also coupled to a second supply terminal (which supplies a voltage $V_{DD}$) through a boot-strap switch BS2, which is described below.

In some embodiments, $V_{DD}$ is approximately one-half the I/O supply voltage for an integrated circuit (or portion thereof) that includes the switching circuit 1700, and $V_X$ and $V_A$ can swing between the I/O supply voltage and $V_{SS}$ for the switching circuit 1700. Thus, the maximum magnitude of the total voltage drop across the diffusion terminals of transistors M31 and M32 is approximately $|V_{DD}-V_A|=V_{DD}$. The magnitude of the total voltage drop across the diffusion terminals of transistors M2A and M2B may be as high as approximately $|V_A-V_X|=$the I/O supply voltage. In some embodiments, one or more (e.g., all) of transistors M2A, M2B, M21, and M22 may be core transistors.

Returning to FIG. 17, the switching circuit 1700 also includes a driver circuit 1702, which drives the input 1703 of the inverter formed by M41 and M42 based on the control signal M2_ON. In some embodiments, the driver circuit 1702 includes switches R21 and R22. The switching terminals of switch R21 are coupled between the $V_A$ node and the gates of M21 and M22. The switching terminals of switch R22 are coupled between the $V_{DD}$ supply terminal (through the boot-strap switch BS2) and the gates of M21 and M22. The control terminal of R21 is coupled to control terminal 147 of the controller 180, which provides a signal M2_ON, and the control terminal of R22 is coupled to control terminal 147 through an inverter, which provides the inverse signal M2_ON'. As described below with reference to FIG. 19D, other implementations of the driver circuit 1702 are possible.

As can be seen in FIG. 17, the switching circuit 1700 also includes a boot capacitor ($C_{B2}$) coupled between the $V_A$ node and the $V_{DD}$ supply terminal, such that the boot capacitor ($C_{B2}$) is coupled across M21 and M22. The charging and discharging of the boot capacitor $C_{B2}$ is controlled by a boot-strapping switch 1704 based on a control signal BS2_ON. In some embodiments, the boot-strapping switch 1704 includes a boot-strap switch BS2, which has switching terminals coupled between (1) the $V_{DD}$ supply terminal and (2) M2B's gate and the boot capacitor $C_{B2}$. As will be described below, during operation of the switching circuit 1700, the maximum magnitude of the voltage $V_{CB2}$ across the boot capacitor $C_{B2}$ is approximately $V_{DD}$. As described below with reference to FIG. 20A, other implementations of the boot-strapping circuit 1704 are possible.

In operation, the controller 180 provides signal M2_ON using the above-described techniques. When signal M2_ON represents L1, M2A and M2B are conducting, and $V_A$ is pulled down to approximately $V_X$. When signal M2_ON represents L0, M2A and M2B are non-conducting, and $V_A$ and $V_X$ are determined (at least in part) by the states of the other solid-state switches M1, M3, and M4. The functionality of the components of the switching circuit 1700 is described in greater detail below.

When signal M2_ON represents L1, the driver circuit 1702 pulls the input 1703 of the inverter formed by M21 and M22 up to $V_A$. (In the embodiment of the driver circuit shown in FIG. 17, when M2_ON represents L1, switch R21 is conducting, and switch R22 is non-conducting.) Thus, the gates of M21 and M22 are pulled up to $V_A$. Since the source of M21 is also at $V_A$, M21 is non-conducting. The source of M22, by contrast, is at $V_A - V_{CB2}$, so M22 is conducting. Thus, the gate of M2A is pulled down to $V_A - V_{CB2}$. Since the source of M2A is coupled to the $V_A$ node, the gate-source voltage of M2A is approximately $V_A - V_{CB2} - V_A = -V_{CB2} = -V_{DD}$, and M2A is conducting. The gate of M2B is also at $V_A - V_{CB2}$, and the source of M2B is coupled to the $V_A$ node through M2A, so the gate-source voltage of M2B is at least $-V_{DD}$ (minus any voltage drop across M2A). Thus, M2B is conducting.

When signal M2_ON represents L0, the driver circuit 1702 pulls the input 1703 of the inverter formed by M21 and M22 down to the voltage of node 1705 ($V_A - V_{CB2}$). (In the embodiment of the driver circuit shown in FIG. 17, when M2_ON represents L0, switch R21 is non-conducting, and switch R22 is conducting.) Thus, the gates of M21 and M22 are pulled down to $V_A - V_{CB2}$. Since the source of M22 is also at $V_A - V_{CB2}$, M22 is non-conducting. The source of M21, by contrast, is at $V_A$. Thus, the gate-source voltage of M21 is approximately $V_A - V_{CB2} - V_A = -V_{CB2} = -V_{DD}$, and M21 is conducting. Thus, the gate of M2A is pulled up to $V_A$. Since the source of M2A is also at $V_A$, M2A is non-conducting. When M2A is non-conducting, M2B is also non-conducting.

Thus, M2A and M2B can be implemented using core transistors, even if $V_A$ and $V_X$ swing rail to rail between the I/O supply rails, because M2A and M2B turn on and off together. Thus, the full rail voltage ($V_{IN}$) never drops across the individual diffusion terminals of either M2A or M2B. M21 and M22 can also be implemented using core transistors, because the maximum voltage drop across either of these transistors is $V_{CB2}$ (which has a maximum magnitude of $V_{DD}$, for purposes of this example) or $|V_{DD} - V_A|$, which also has a maximum magnitude of $V_{DD}$. Likewise, switches R21 and R22 can be implemented using core transistors, because the maximum magnitude of the voltage drop across either of these switches is approximately $V_{DD}$.

The above-described operation of the switching circuit 1700 is dependent on the boot-strap capacitor $C_{B2}$ being charged to a suitable voltage $V_{CB2}$ at suitable times. For example, the switching circuit 1700 operates as described above if the voltage $V_{CB2}$ across the boot-strap capacitor $C_{B2}$ is maintained at approximately $V_{DD}$ during the switching circuit's operation.

The charging and discharging of the boot-strap capacitor $C_{B2}$ are controlled by the boot-strapping switch 1704. As can be seen in FIG. 17, when the boot-strapping switch decouples the boot-strap capacitor $C_{B2}$ from $V_{DD}$ (e.g., by opening switch BS2), the lower terminal of the capacitor $C_{B2}$ is floating, thereby facilitating maintenance of the capacitor's charge. When the boot-strapping switch couples the boot-strap capacitor $C_{B2}$ to $V_{DD}$ (e.g., by closing switch BS2), the lower terminal of the capacitor is coupled to the $V_{DD}$ terminal, and the upper terminal of the capacitor is coupled to the $V_A$ node. Thus, the capacitor $C_{B2}$ charges (or discharges) to approximately $V_A - V_{DD}$. The voltage across capacitor $C_{B2}$ can therefore be set to approximately $V_{DD}$ by closing the switch BS2 when $V_A$ is at approximately the I/O supply voltage. Thus, in some embodiments, the control terminal BS2_ON of the boot-strapping switch 1704 may be coupled to the gate of M1A, or to control terminal 137 (on which the controller provides the M1_ON signal).

In some embodiments, the boot switch BS2 is implemented using core transistors. During operation of the switching circuit 1700, the maximum voltage across BS2's switching terminals is approximately $V_{DD} - (V_A - V_{BC2}) = V_{DD} + V_{BC2} =$ the I/O supply voltage. Thus, the boot switch BS2 can be implemented using two or more core transistors in a cascode configuration, an I/O transistor, or any other suitable component(s).

Figure 18A:
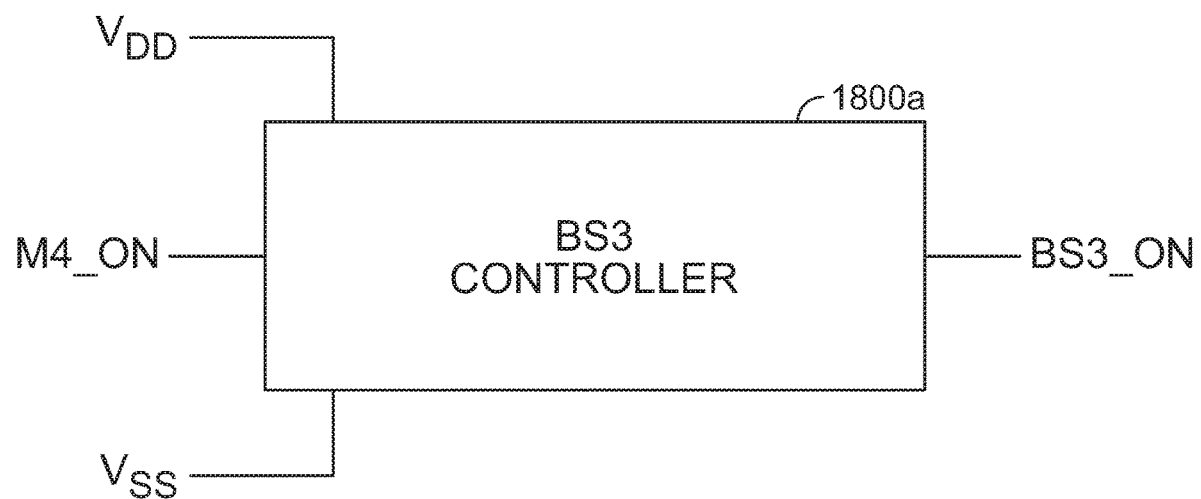
FIG. 18A is a block diagram of a boot switch controller, according to some embodiments.

FIG. 18A shows a block diagram of a boot-strapping switch controller 1800a, according to some embodiments. The boot-strapping switch controller 1800a is operable to provide a signal BS3_ON that has a "logical 1" value when $V_B$ is at approximately $V_{SS}$. In some embodiments, the boot-strapping switch controller 1800a generates the BS3_ON signal based on the value of the M4_ON signal. As described above with reference to FIG. 15, the $V_B$ node is pulled down to $V_{SS}$ when the gate voltage ($V_{G4}$) of transistor M4B is pulled up to $V_{DD}$, which occurs shortly after signal M4_ON switches to L1. Thus, in some embodiments, the output terminal (BS3_ON) of the boot-strapping switch controller 1800a is coupled to the gate of M4B, or to the control terminal 167 (on which the controller 180 provides the M4_ON signal).

Figure 18B:
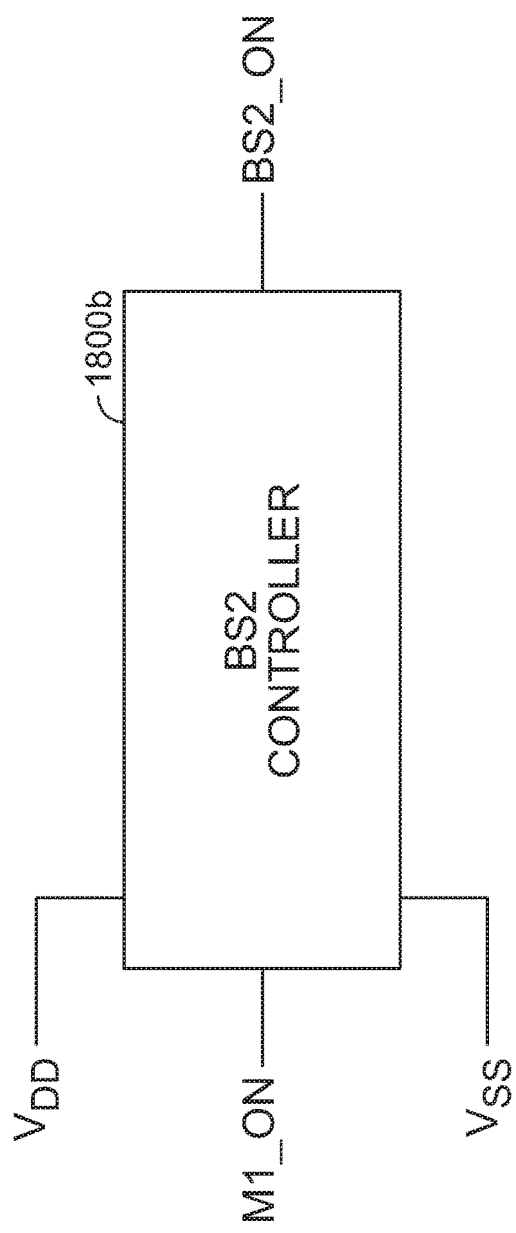
FIG. 18B is a block diagram of another boot switch controller, according to some embodiments.

FIG. 18B shows a block diagram of a boot switch controller 1800b, according to some embodiments. The boot-strapping switch controller 1800b is operable to provide a signal BS2_ON that has a "logical 1" value when $V_A$ is at approximately the I/O supply voltage. In some embodiments, the boot-strapping switch controller 1800b generates the BS2_ON signal based on the value of the M1_ON signal. As described above with reference to FIG. 14, the $V_A$ node is pulled up to $V_{IN}$ (the I/O supply voltage) when the gate voltage ($V_{G1}$) of transistor M1A is pulled down to $V_{DD}$, which occurs shortly after signal M1_ON switches to L1. Thus, in some embodiments, the output terminal (BS2_ON) of the boot-strapping switch controller 1800b is coupled to the gate of M1A, or to the control terminal 137 (on which the controller 180 provides the M1_ON signal).

Figure 18C:
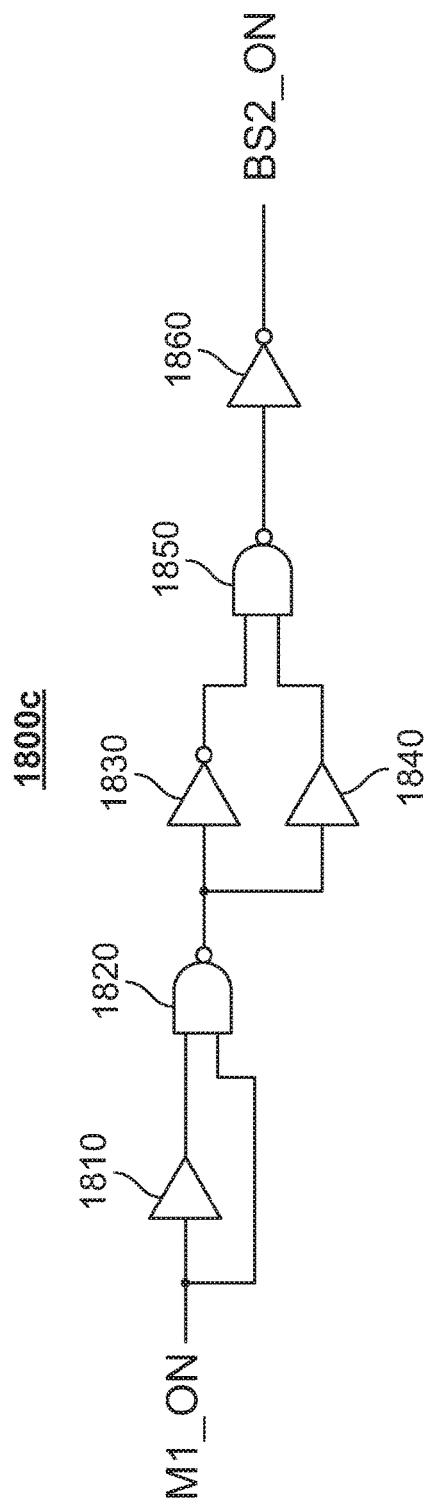
FIG. 18C is a schematic of a boot switch controller, according to some embodiments.

FIG. 18C shows a schematic of circuit 1800c that implements an embodiment of the boot-strapping switch controller 1800b. As one of ordinary skill in the art can appreciate, the circuit 1800c generates a positive pulse for a period of approximately 2 ns. The pulse is generated approximately 100 ps after a positive edge is detected on signal M1_ON. Other pulse periods and delay periods relative to the positive edge of M1_ON are possible.

FIGS. 19A, 19B, 19C, and 19D show schematics of some embodiments of driver circuits 1402, 1502, 1602, and 1702, respectively.

In some embodiments, the driver circuit 1402 includes a chain of one or more series-coupled inverters, with the input of the chain coupled to receive M1_ON and the output of the chain coupled to node 1403. The inverters may be configured to pull up to $V_{IN}$ and pull down to $V_{DD}$. In some embodiments, the strength and/or size of the inverters increases from the input of the chain to the output of the chain.

In some embodiments, the driver circuit 1502 includes a chain of one or more series-coupled inverters, with the input of the chain coupled to receive M4_ON and the output of the chain coupled to node 1503. The inverters may be configured to pull up to $V_{DD}$ and pull down to $V_{SS}$. In some embodiments, the strength and/or size of the inverters increases from the input of the chain to the output of the chain.

In some embodiments, the driver circuit 1602 includes a chain of one or more series-coupled inverters, with the input of the chain coupled to receive M3_ON and the output of the chain coupled to node 1603. The inverters may be configured to pull up to node 1605 (e.g., $V_B+V_{CB3}$) and pull down to $V_B$. In some embodiments, the strength and/or size of the inverters increases from the input of the chain to the output of the chain.

In some embodiments, the driver circuit 1702 includes a chain of one or more series-coupled inverters, with the input of the chain coupled to receive M2_ON and the output of the chain coupled to node 1703. The inverters may be configured to pull up to $V_A$ and pull down to node 1705 (e.g., $V_A-V_{CB2}$). In some embodiments, the strength and/or size of the inverters increases from the input of the chain to the output of the chain.

In some embodiments, one or more (e.g., each) of the driver circuits (1402, 1502, 1602, 1702) may include a level converter at the input of the first inverter in the inverter chain, to level convert the input signal (M1_ON, M4_ON, M3_ON, M2_ON) to the voltage domain defined by the rail voltages to which the inverters are configured to pull up and down.

FIGS. 20A and 20B show schematics of some embodiments of boot-strapping switches 1604 and 1704, respectively.

As can be seen in FIG. 20A, in some embodiments, the boot-strapping switch 1604 includes a transistor (e.g., an I/O transistor). The transistor's source-drain terminals may be coupled between $V_{DD}$ and node 1605. The transistor's gate terminal may be coupled to input terminal BS3_ON, and may receive thereon a signal that activates the transistor when $V_B$ is approximately equal to $V_{SS}$. In some embodiments, rather than a single transistor, the boot-strapping switch 1604 may include two or more transistors (e.g., core transistors) coupled in series and in a cascode configuration.

As can be seen in FIG. 20B, in some embodiments, the boot-strapping switch 1704 includes a transistor (e.g., an I/O transistor). The transistor's source-drain terminals may be coupled between $V_{DD}$ and node 1705. The transistor's gate terminal may be coupled to input terminal BS3_ON, and may receive thereon a signal that activates the transistor when $V_A$ is approximately equal to $V_{IN}$. In some embodiments, rather than a single transistor, the boot-strapping switch 1704 may include two or more transistors (e.g., core transistors) coupled in series and in a cascode configuration.

Some embodiments have been described in which a stack of two series-coupled core transistors in a cascode configuration is used in place of an I/O transistor. In some embodiments, a stack of three or more series-coupled core transistors in a cascode configuration may be used, without departing from the principles described herein.

Some embodiments have been described in which a boot-strapping circuit is used to perform boot-strapping in a switched regulation circuit. The boot-strapping techniques described herein may be embodied in different circuits, and boot-strapping circuits that use the boot-strapping techniques described herein may be used in devices other than switched regulation circuits.

TERMINOLOGY

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B'") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

EQUIVALENTS

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A solid-state switch having first and second switch terminals and a control terminal, the solid-state switch comprising:
   first, second, third, and fourth core transistors; and
   a circuit component having a control terminal coupled to the control terminal of the solid-state switch,
   wherein a first diffusion terminal of the first core transistor is coupled to a first diffusion terminal of the second core transistor,
   wherein a first diffusion terminal of the third core transistor is coupled to a first diffusion terminal of the fourth core transistor, and is coupled to a gate terminal of the first core transistor via a first conductive path consisting of one or more non-parasitic circuit components,
   wherein a second diffusion terminal of the fourth core transistor is coupled to a gate terminal of the second core transistor via a second conductive path consisting of one or more non-parasitic circuit components,
   wherein a second diffusion terminal of the first core transistor is coupled to a second diffusion terminal of the third core transistor and to the first switch terminal of the solid-state switch,
   wherein a second diffusion terminal of the second core transistor is coupled to the second switch terminal of the solid-state switch, and
   wherein the circuit component is configured to selectively switch gate terminals of the third and fourth core transistors between a first configuration in which said gate terminals of the third and fourth core transistors are coupled to the first switch terminal via a third conductive path consisting of one or more non-parasitic circuit components and a second configuration in which said gate terminals of the third and fourth core transistors are coupled to a supply terminal via a fourth conductive path consisting of one or more non-parasitic circuit components.

2. The solid-state switch of claim 1, wherein the supply terminal is coupled to the gate terminal of the second core transistor.

3. The solid-state switch of claim 2, wherein the circuit component comprises:
   a first switch having first and second switch terminals and a control terminal, the first and second switch terminals of the first switch being coupled between the first switch terminal and the gate terminals of the third and fourth core transistors, the control terminal of the first switch being coupled to the control terminal of the circuit component; and
   a second switch having first and second switch terminals and a control terminal, the first and second switch terminals of the second switch being coupled between the supply terminal and the gate terminals of the third and fourth core transistors, the control terminal of the second switch being coupled to the control terminal of the circuit component.

4. The power conversion circuit of claim 2, wherein the at least one solid-state switch further comprises a boot circuit, the boot circuit comprising:
   a boot capacitor coupled between the second diffusion terminal of the first core transistor and the supply terminal; and
   a boot-strapping switch having a pair of boot-strapping switch terminals and a boot-strapping switch control terminal, the pair of boot-strapping switch terminals coupled between the supply terminal and a terminal of the boot capacitor.

5. The solid-state switch of claim 2, wherein each of the first, second, and third core transistors is a p-channel MOSFET, and wherein the fourth core transistor is an n-channel MOSFET.

6. The solid-state switch of claim 1, wherein the third and fourth core transistors are configured to operate as an inverter, and wherein an output of the inverter is configured to drive the gate terminal of the first core transistor.

7. The solid-state switch of claim 1, wherein each of the first, second, third, and fourth core transistors is configured to operate as a switch.

* * * * *